United States Patent
Madan

(10) Patent No.: US 7,087,493 B1
(45) Date of Patent: Aug. 8, 2006

(54) MEMORY WITH 6T SMALL ASPECT RATIO CELLS HAVING METAL_1 ELEMENTS PHYSICALLY CONNECTED TO METAL_0 ELEMENTS

(75) Inventor: Sudhir K. Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1235 days.

(21) Appl. No.: 09/921,394

(22) Filed: Aug. 2, 2001

Related U.S. Application Data

(60) Provisional application No. 60/223,913, filed on Aug. 9, 2000.

(51) Int. Cl.
*H01L 29/80* (2006.01)

(52) U.S. Cl. .................... 438/284; 257/369

(58) Field of Classification Search ........ 438/128–129, 438/199, 284, 286; 257/204–208, 365, 369, 257/401
See application file for complete search history.

(56) References Cited

U.S. PATENT DOCUMENTS

| | | | | |
|---|---|---|---|---|
| 5,656,861 A | * | 8/1997 | Godinho et al. | 257/758 |
| 5,691,559 A | * | 11/1997 | Kimura | 257/369 |
| 5,886,375 A | * | 3/1999 | Sun | 257/296 |

OTHER PUBLICATIONS

"Highly Scalable and Fully Compatible SRAM Cell Technology with Metal Damascene Process and W Local Interconnect," 0-7803-4700-6/98 IEEE; by M. Inohara, H. Oyamastu, Y Unno, Y FuKaura, S. Goto, Y. Egi, and M. Kinugawa.

"A Novel 6.4μm² Full-CMOS SRAM Cell with Aspect Ration of 0.63 in a High-Performance 0.25 μm-Generation CMOS Technology"; 0-7803-4700-6/98; 1998 IEEE; by K. J. Kim, J. M. Younn, S. B. Kim, J. H. Kim, S. H. Hwang, K. T. Kim, and Y. S. Shin.

* cited by examiner

*Primary Examiner*—David Nelms
*Assistant Examiner*—David Vu
(74) *Attorney, Agent, or Firm*—Jacqueline J. Garner; W. James Brady, III; Frederick J. Telecky, Jr.

(57) ABSTRACT

A method of forming a memory circuit comprising six transistor memory cells. The memory cells comprise first and second inverters. The inverters comprise respective first and second drive transistors and first and second pull-up transistors. The method also forms a plurality of conducting plugs. A first conducting plug is coupled to the first inverter and a second conducting plug is coupled to the first pull-up transistor and to the gates of the second drive transistor and the second pull-up transistor. A third conducting plug is coupled to the second inverter and a fourth conducting plug coupled to the second pull-up transistor and to the gates of the first drive transistor and the first pull-up transistor. The method also forms conducting elements. A first conducting element contacts the first conducting plug and the second conducting plug and a second conducting element contacts the third conducting plug and the fourth conducting plug.

34 Claims, 8 Drawing Sheets

US 7,087,493 B1

MEMORY WITH 6T SMALL ASPECT RATIO CELLS HAVING METAL_1 ELEMENTS PHYSICALLY CONNECTED TO METAL_0 ELEMENTS

This application claims priority under 35 USC § 119(e)(1) of provisional application No. 60/223,913 filed Aug. 9, 2000.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to transistor circuits, and are more particularly directed to a memory with small aspect ratio storage cells.

The technology of many modern circuit applications continues to advance at a rapid pace, with one highly developed and incredibly prolific type of circuit being digital memory. For such memories, consideration is given to all aspects of design, including maximizing efficiency, lowering manufacturing cost, and increasing performance. These considerations may be further evaluated based on the integrated circuit device in which the memory is formed, where such circuits may be implemented either as stand-alone products, or as part of a larger circuit such as a microprocessor. One often critical factor with respect to digital memories is the cost of the device and this cost is often affected by the size of each memory cell and the overall size of the memory architecture.

In the current art, memory size may be affected by various factors. In one prior art approach as detailed later, a static random access memory ("SRAM") memory is constructed using individual cells known as 6T cells which are constructed using a formation of six different transistors. In this as well as other SRAM cell configurations, the cell size, the overall memory size, and manufacturing cost are very much affected by the layout of the various layers or layer-formed components of the SRAM cell. For example and as detailed further later, in one prior art approach, a 6T cell is provided having an aspect ratio (i.e., bit line dimension/word line dimension) on the order of 0.50. The cell is achieved by forming each of the six transistors to have parallel gates in the word line dimension, where the n-channel active regions for each pair of access and drive transistors are formed using a continuous strip in the bit line dimension, and where the p-channel active regions for each pull-up transistor is also in the bit line dimension and isolated from the active regions of all the other transistors. However, based on the more detailed presentation of this approach provided below, one skilled in the art will appreciate that the prior art implementations of such an approach may give rise to various drawbacks.

In view of the above, and as technology advances to the next generation, there is a need to address the drawbacks of the prior art and to simplify the formation of various layers on the semiconductor substrate. The preferred embodiments described below address these drawbacks and thereby provide a more efficient and desirable integrated circuit configuration.

BRIEF SUMMARY OF THE INVENTION

In the preferred embodiment, there is a method of forming memory circuit comprising a plurality of six transistor memory cells. The method forms each of the six transistor memory cells to comprise a first inverter having an input and an output and a second inverter having an input and an output. The first inverter comprises a first transistor forming a first drive transistor comprising first and second source/drain regions and a gate and a second transistor forming a first pull-up transistor comprising first and second source/drain regions and a gate. The output of the first inverter is coupled to first source/drain region of the first drive transistor and to the first source/drain region of the first pull up transistor. The second inverter comprises a third transistor forming a second drive transistor comprising first and second source/drain regions and a gate and a fourth transistor forming a second pull-up transistor comprising first and second source/drain regions and a gate. The output of the second inverter is coupled to the first source/drain region of the second drive transistor and to the first source/drain region of the second pull up transistor. Each cell further comprises a fifth transistor forming a first access transistor having a gate, and having first source/drain region coupled to the output of the first inverter and a second source/drain region for communicating to a first bit line and a sixth transistor forming a second access transistor having a gate, and having a first source/drain region coupled to the output of the second inverter and a second source/drain region for communicating to a second bit line. The method also forms at least one insulating layer in a position relative to the first through sixth transistors, and applies a first mask to the at least one insulating layer to form a plurality of vias through the at least one insulating layer. The method also forms a first conducting layer comprising a plurality of conducting plugs in the plurality of vias. The plurality of conducting plugs comprise a first conducting plug coupled to the first source/drain region of the first drive transistor and a second conducting plug coupled to the first source/drain region of the first pull-up transistor and to the gate of the second drive transistor and to the gate of the second pull-up transistor. The plurality of conducting plugs further comprise a third conducting plug coupled to the first source/drain region of the second drive transistor and a fourth conducting plug coupled to the first source/drain region of the second pull-up transistor and to the gate of the first drive transistor and to the gate of the first pull-up transistor. The method also forms a second conducting layer comprising a plurality of conducting elements. The plurality of conducting elements comprise a first conducting element coupled to and physically contacting the first conducting plug and coupled to and physically contacting the second conducting plug and a second conducting element coupled to and physically contacting the third conducting plug and coupled to and physically contacting the fourth conducting plug. Other circuits, systems, and methods are also disclosed and claimed.

BRIEF DESCRIPTION OF THE SEVERAL VIEWS OF THE DRAWING

FIG. 1b illustrates a schematic of a 6T memory cell circuit which may be used for each of the storage cells in FIG. 1a.

FIG. 2b illustrates a cross-sectional view of a prior art drive transistor shown in FIG. 2a.

FIG. 5b illustrates a cross-sectional view of a drive transistor shown in FIG. 5a.

DETAILED DESCRIPTION OF THE INVENTION

As an introduction before proceeding with a detailed discussion of the preferred inventive embodiments, FIGS. 1a and 1b as well as the following discussion present an explanation of an integrated circuit 10 including a memory configuration 20, and where both the prior art and the inventive embodiments described below may be implemented within memory configuration 20. Accordingly, the following discussion first examines memory configuration 20 in general and then is followed by a discussion of cell architectures that may be implemented in that configuration both according to the prior art and the preferred embodiments. Looking generally to integrated circuit 10, it is typical of that in the art and, thus, includes components formed using a semiconductor substrate and various layers formed in relation to that substrate. Indeed, by way of further example with respect to the prior art, FIGS. 2a through 4d discussed later illustrate a specific type of layout that may be used in memory configuration 20. Before reaching that discussion, however, certain schematic details are first addressed in the context of FIGS. 1a and 1b.

Figure 1A:
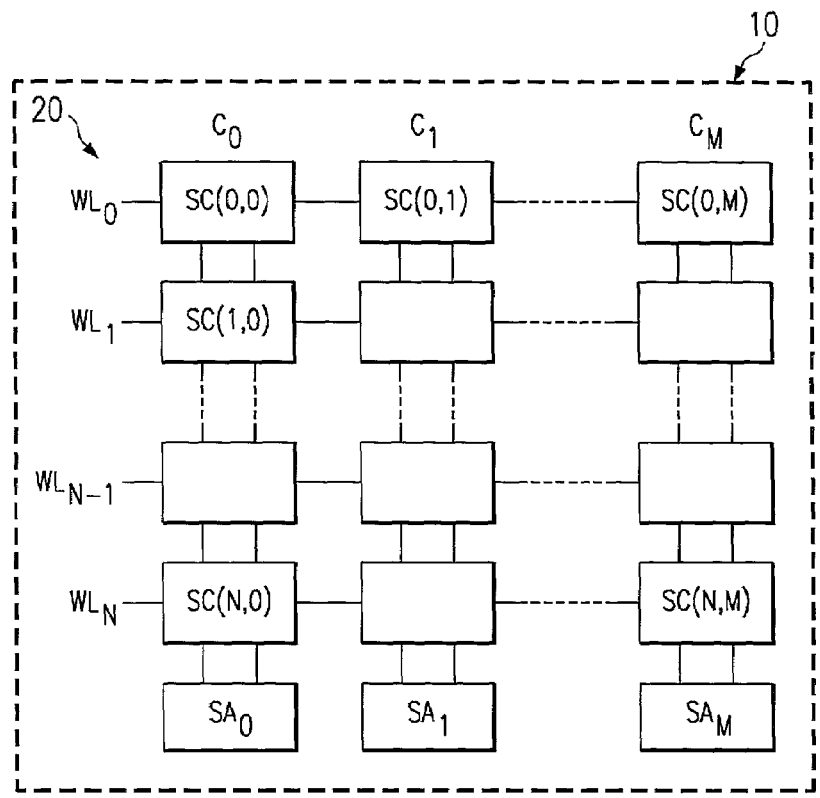
FIG. 1a illustrates an integrated circuit including a memory configuration formed in an array fashion and having a plurality of memory storage cells.

Looking in detail to FIG. 1a, it illustrates memory configuration 20 generally in a combined block and schematic form. Memory configuration 20 is generally connected in an array form, thereby presenting a number of word lines $WL_0$ through $WL_N$ each aligned in the x-dimension and a number of columns $C_0$ through $C_M$ each aligned in the y-dimension. At the intersection of each word line and column is a storage cell abbreviated SC, and some of which are shown by way of example as having a coordinate (WL,C) such that the first element specifies the word line corresponding to the storage cell and the second element specifies the column corresponding to the storage cell. The array nature of memory configuration 20 permits either writing data to, or reading data from, a storage cell on a word line basis. In other words, one or more storage cells along the same word line may be accessed (i.e., for either read or write) at a time.

Memory configuration 20 is representative of a static random access memory ("SRAM") and, consequently, for each column a pair of conductors extends between storage cells along the column, where these conductors are referred to in the art as bit lines. The bit lines permit either reading or writing of a cell connected to a given pair of bit lines, as introduced generally here and as detailed further in connection with FIG. 1b, below. Turning first to an introduction of these operations, for purposes of writing data to the cell, one of the two bit lines is pulled down with some external write circuit (not shown), and then the word line of the cell is asserted to write the data state to the cell in response to the pulled down bit line. For purposes of reading data from the cell, the two bit lines for a given cell provide two respective signals which are compared to one another to determine the data stored at a cell along a selected one of the word lines. More specifically, the signals provided by each bit line pair in FIG. 1a are connected to corresponding sense amplifier circuits, shown as $SA_0$ through $SA_M$. For purposes of discussion, the subscript of each of the sense amplifier circuits matches that of the column to which it corresponds. Each of sense amplifier circuits $SA_0$ through $SA_M$ includes circuitry for "sensing" the differential voltage along the paired bit lines by amplifying it. Typically, the differential voltage is either amplified to a full scale signal, or there may be stages which amplify the current drive to some level having a lesser signal swing then a full scale signal. This signal may then be used by other circuitry, either internally on integrated circuit 10 or external from that device. Note also that FIG. 1a illustrates each sense amplifier circuit as connected only to a single pair of corresponding column conductors by way of example, whereas other variations may exist in the correlation between column conductors and sense amplifier circuits. Thus, as an alternative to that shown in FIG. 1a, an embodiment may be created where more than two bit lines are connected by some multiplexing functionality to a single sense amplifier circuit; consequently, one pair of these bit lines may then be selected at a time to provide a differential signal to the sense amplifier circuit.

Figure 1B:
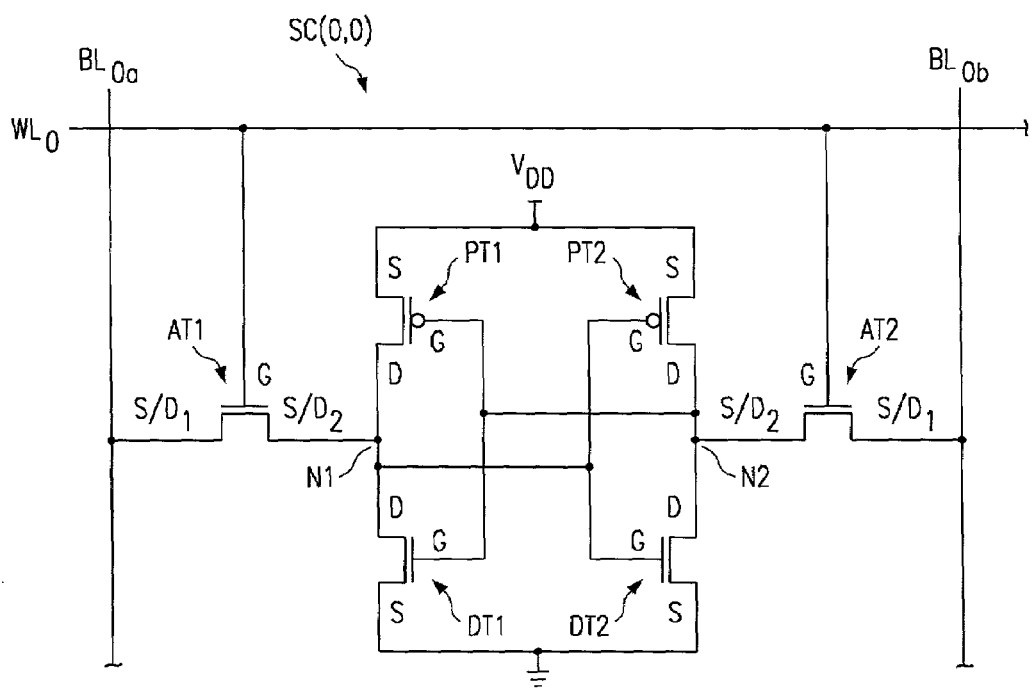

FIG. 1b illustrates a schematic of storage cell SC(0,0) in greater detail, with it understood that each of the remaining storage cells of FIG. 1a is constructed in the same manner (yet, of course, connected to a different one of either a word line or pair of bit lines, or both). At the outset, note for further discussion that the bit lines from column $C_0$ of FIG. 1a are designated in FIG. 1b with the abbreviation "$BL_0$", and are further distinguished from one another by adding one of the letters "a" and "b" to the subscripts for these conductors. Storage cell SC(0,0) is what is referred to in the art as a 6T cell, meaning it includes six transistors. For purposes of presenting a basis for a functional description below, each of these transistors is further referred to by combining the word "transistor" with a descriptive term relating to the function of the transistor. In this regard, storage cell SC(0,0) includes two access transistors AT1 and AT2, two pull-up transistors PT1 and PT2, and two drive transistors DT1 and DT2. Note that the functional terms "access" and "drive" are chosen to facilitate an understanding by one skilled in the art but are not by way of limitation, as other terms are also sometimes used in the art for such transistors. For example, the access transistor are sometimes referred to as passgate transistors. As another example, the drive transistors are sometimes referred to as pull-down or discharge transistors. As still another example, the pull-up transistors are sometimes referred to as load transistors. In any event, from the additional details including the connection and function of each of these transistors as provided below, one skilled in the art will appreciate those transistors which are the subject of the present inventive embodiments, regardless of the particular terminology directed to such transistors.

Turning first to the two access transistors AT1 and AT2, both are n-channel transistors and are connected in a symmetric manner. Accordingly, the following discussion first addresses access transistor AT1 followed by a brief discussion of the similar nature of access transistor AT2. The gate of access transistor AT1 is connected to word line $WL_0$. As a transistor, access transistor AT1 has two regions which are commonly characterized as source and drain regions. Specifically, often for a transistor, one of these regions is referred to as the source while the other is the drain, based on the relative potentials connected to those regions. However, in an implementation such as storage cell SC(0,0), the potential at either region may swing relative to the other and, thus, a given region may in one instance be considered the source while in another instance may be considered the drain. For this reason, from this point forward and also for the remaining comparable transistors discussed in this document each region may be referred to as a source/drain. Given that convention, access transistor AT1 has two source/drains $S/D_1$ and $S/D_2$. Source/drain $S/D_1$ is connected to bit line $BL_{0a}$ and source/drain $S/D_2$ is connected to a node N1. Looking now to access transistor AT2, its gate is also connected to word line $WL_0$. A first source/drain $S/D_1$ of access transistor AT2 is connected to bit line $BL_{0b}$ while a second source/drain $S/D_2$ of access transistor AT2 is connected to a node N2.

Looking now to pull-up transistors PT1 and PT2, both are p-channel transistors and connected in a symmetric manner. Turning first to pull-up transistor PT1, its source is connected to a relatively high voltage, which is shown as $V_{DD}$ as is customary in the transistor art. The drain of pull-up transistor PT1 is connected to node N1. Further, note here, and for the remainder of this document, the choice of terminology between "source" and "drain" is only based on the voltages anticipated at those regions and, therefore, such regions could more generally be assumed as source/drain regions to fully illustrate the scope of the discussion. Lastly, the gate of pull-up transistor PT1 is connected to two other points. First, the gate is connected to the gate of drive transistor DT1. Second, the gate is connected to node N2. Looking now to pull-up transistor PT2, its source is connected to $V_{DD}$ and its drain is connected to node N2. The gate of pull-up transistor PT2 is connected to the gate of drive transistor DT2 and to node N1.

With reference to drive transistors DT1 and DT2, both are n-channel transistors and also are connected in a symmetric manner. Turning first to drive transistor DT1, its source is connected to ground and its drain is connected to node N1. The gate of drive transistor DT1, as mentioned above, is connected to the gate of pull-up transistor PT1 and to node N2. Looking to drive transistor DT2, its source is connected to ground and its drain is connected to node N2. The gate of drive transistor DT2 is connected to the gate of pull-up transistor PT2 and to node N1.

Having now described the connections of each of the six transistors in storage cell SC(0,0), one skilled in the art will generally recognize that pull-up transistor PT1 and drive transistor DT1 are connected as an inverter with its input (i.e., the tied gates of those two transistors) connected to node N2, while pull-up transistor PT2 and drive transistor DT2 are connected as an inverter with its input (i.e., the tied gates of those two transistors) connected to node N1; thus, these two inverters are generally considered cross-coupled, and the outputs of each inverter is accessible by a respective access transistor AT1 or AT2. These connections are further appreciated from the following discussion of the operation of storage cell SC(0,0).

In operation, a binary value may be either written to, or read from, storage cell SC(0,0). When power is first applied to storage cell SC(0,0), it will assume one of two binary states, with the state being understood as random at this initial point of operation. The cases of either a subsequent write of data to storage cell SC(0,0), or a read from storage cell SC(0,0), are discussed separately below.

A write to storage cell SC(0,0) is as follows. First, one of bit lines $BL_{0a}$ and $BL_{0b}$ is pulled low by some write circuit (not shown) while the other remains high. For an example, assume that bit line $BL_{0a}$ is pulled low and, thus, bit line $BL_{0b}$ remains high. Next, word line $WL_0$ is asserted high which enables access transistors AT1 and AT2 by placing the high signal at the gates of those transistors; in this regard, note that the term "enable" is intended as known in the art to indicate that a sufficient gate-to-source potential is provided such that the transistor channel fully conducts. Additionally, although other storage cells are not shown in FIG. 1b, note that other cells that likewise have access transistors connected to word line $WL_0$ are concurrently enabled for writing due to the enabling signal on word line $WL_0$. Returning to storage cell SC(0,0), the enabling of access transistor AT1 connects node N1 to the low potential at bit line $BL_{0a}$. Due to the relative current drive capabilities of the transistors of storage cell SC(0,0), bit line $BL_{0a}$ pulls node N1 low. With node N1 low, pull-up transistor PT2 is enabled and drive transistor DT2 is disabled, thereby bringing node N2 to $V_{DD}$. Further, the voltage of $V_{DD}$ at node N2 is connected to the gate of drive transistor DT1 and, therefore, enables drive transistor DT1. Since drive transistor DT1 is enabled, node N1 continues to be pulled to ground and, thus, node N1 is maintained at ground even after word line $WL_0$ is no longer enabling to access transistors AT1 and AT2. Consequently, storage cell SC(0,0) maintains the stored data state until it is thereafter changed by a subsequent write operation. Further, from the preceding, one skilled in the art will also appreciate the comparable yet complementary operation of writing the opposite state to storage cell SC(0, 0).

A read from storage cell SC(0,0) is as follows. At the outset, for the sake of the following example, assume that the following read occurs after the above-described write and, thus, at this time node N1 is low while node N2 is high. Turning to the read operation, first both bit lines $BL_{0a}$ and $BL_{0b}$ are precharged high. Second, word line $WL_0$ is enabled, once again enabling access transistors AT1 and AT2. Next, and again due to the differing drive current capabilities of the cell transistors, the low signal at node N1 is effectively transferred to $BL_{0a}$; more particularly, the combination of the enabled access transistor AT1 and the enabled drive transistor DT1 pulls the precharged voltage of bit line $BL_{0a}$ low. At the same time, however, the precharged voltage at bit line $BL_{0b}$ is not disturbed. Consequently, sense amplifier $SA_0$ (see FIG. 1a) next amplifies the differential voltage between bit lines $BL_{0a}$ and $BL_{0b}$, thereby providing a voltage which based on the relative values between those bit lines represents a binary state for storage cell SC(0,0).

Further, from the preceding, one skilled in the art will also appreciate the comparable yet complementary operation of reading the opposite state from storage cell SC(0,0).

Figure 2A:
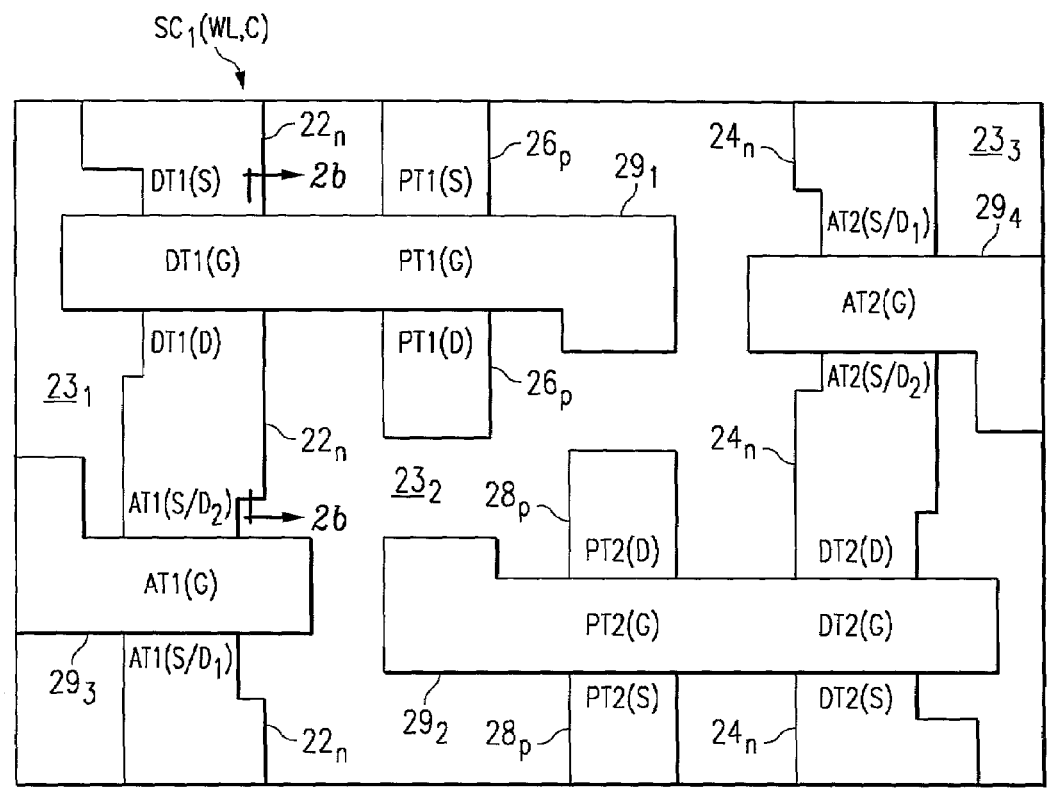
FIG. 2a illustrates a top view of the layout of a prior art 6T SRAM memory cell.

FIG. 2a illustrates a top view of a semiconductor device cell structure used for the cells in memory configuration 20 according to the prior art, and by way of reference the FIG. 2a cell is shown generally as $SC_1(WL,C)$. In FIG. 2a, several of the steps of fabrication of the semiconductor device have been completed and are shown, while others are not shown to simplify the Figure or are discussed below in connection with additional formation steps. In general, cell $SC_1(WL,C)$ is formed in connection with an underlying semiconductor substrate not directly visible in the perspective of FIG. 2a, and by way of example let this semiconductor substrate be a p-type substrate. Looking further to FIG. 2a, it illustrates various additional regions and components in connection with or overlying that substrate, as further demonstrated below.

In FIG. 2a, a first n-channel active region $22_n$ is formed generally in the y-dimension in cell $SC_1(WL,C)$, that is, along the direction of the bit lines which are not shown but also which are understood to be in this same direction. Further, region $22_n$ is formed generally along one side (i.e., the left side) of cell $SC_1(WL,C)$. A second n-channel active region $24_n$ is also formed generally in the y-dimension of cell $SC_1(WL,C)$, but toward the right edge of cell $SC_1(WL,C)$. Second n-channel active region $24_n$ is symmetric with respect to second n-channel active region $22_n$, but region $24_n$ is flipped with respect to region $22_n$. As further appreciated below, one skilled in the art should appreciate that each of n-channel active regions $22_n$ and $24_n$ is a continuous region along cell $SC_1(WL,C)$, yet the continuity of each region is not directly visible in FIG. 2a due to the additional layers formed over those continuous regions.

Toward the left middle of cell $SC_1(WL,C)$, a first p-channel active region $26_p$ is formed along the y-dimension, but region $26_p$ does not extend the full length of cell $SC_1(WL,C)$. A second p-channel active region $28_p$ is also formed along the y-dimension of $SC_1(WL,C)$ but to the right middle of the cell, and it too does not extend the full length of cell $SC_1(WL,C)$. Thus, second p-channel active region $28_p$ is symmetric with respect to first p-channel active region $26_p$, and region $28_p$ is flipped with respect to region $26_p$. Both p-channel active regions $26_p$ and $28_p$ may be formed in an n-type well which is formed within the p-type semiconductor substrate, where such an n-type well is shown in a later Figure. As a few additional observations, note first that each of regions $22_n$, $24_n$, $26_p$, and $28_p$ is being referred to as an active region in that a current may be caused to flow along each region. The four active regions are physically isolated from each other by trench isolation structures $23_1$, $23_2$, and $23_3$. Note further that portions of regions $22_n$, $24_n$, $26_p$, and $28_p$ form different source/drains for the various six transistors in cell $SC_1(WL,C)$ as shown by reference identifiers in FIG. 2a, and as further discussed later.

Completing FIG. 2a, also illustrated are various polysilicon structures $29_1$ through $29_4$. Polysilicon structures $29_1$ through $29_4$ are formed at the same time using appropriate patterning and are shaped such that the majority of the area of each of those structures is formed in the x-dimension, that is, along the direction of the word lines which are not shown but also which are understood to be in this same direction (i.e., perpendicular to the above-discussed y-dimension for the bit lines). Further, each of the polysilicon structures $29_1$ through $29_4$ overlies one or more active regions for reasons more clear below. Polysilicon structures $29_2$ and $29_4$ are symmetric, but flipped, with respect to polysilicon structures $29_1$ and $29_3$, respectively. Lastly, note that due to the layout aspects of cell $SC_1(WL,C)$ as illustrated in FIG. 2a, namely, the continuous active regions in the y-dimension, the polysilicon structures primarily in the x-dimension, and the symmetric and the flipped nature of the cell, this cell is being referred to as a small aspect ratio SRAM cell. Further, for the example of FIG. 2a, the aspect ratio of the cell is on the order of 0.5.

Figure 2B:
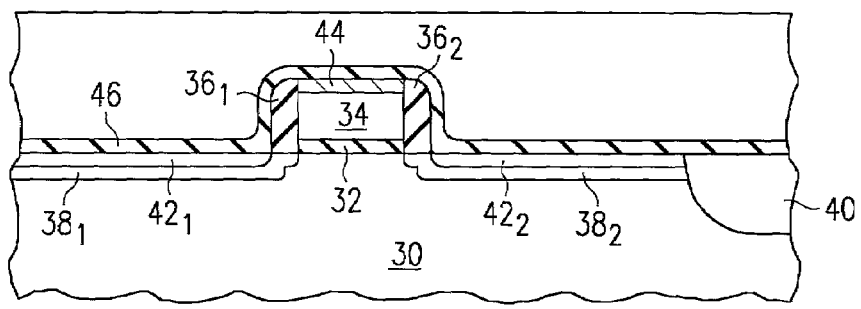

By way of further background, FIG. 2b illustrates a cross-sectional view of cell $SC_1(WL,C)$ along the line indicated at 2b in FIG. 2a. In FIG. 2b, a substrate 30 (e.g., p-type) is shown, and a gate insulator 32 is formed above substrate 30 with a polysilicon gate 34 formed above gate insulator 32 and insulating sidewalls $36_1$ and $36_2$ formed along the sides of polysilicon gate 34. Two separate n-type doped regions $38_1$ and $38_2$ are formed in substrate 30 and in n-channel active region $22_n$ from FIG. 2a, and these regions extends under insulating sidewalls $36_1$ and $36_2$, respectively. A trench isolation oxide region 40 is also shown. Above each of n-type doped regions $38_1$ and $38_2$ is formed a respective silicide region $42_1$ and $42_2$. A silicide layer 44 is formed above polysilicon gate 34, and an insulating layer 46, such as silicon nitride, is formed over silicide layer 44 as well as over trench isolation oxide region 40 and silicide regions $42_1$ and $42_2$. Lastly, an oxide layer 48 (e.g., silicon oxide) is formed over insulating layer 46, and is planarized as shown in FIG. 2b.

Looking now to all of FIGS. 1b, 2a, and 2b, one skilled in the art may further appreciate how the layout of FIG. 2a depicts various of the device components shown in FIG. 1b. For example, starting in the upper left of FIG. 2a, the components forming drive transistor DT1 are shown, and which are labeled accordingly. For example, the source of drive transistor DT1 is labeled DT1(S) in FIG. 2a, and it may be appreciated that this source is further represented in FIG. 2b as n-type doped region $38_1$ (which is electrically accessible via silicide $42_1$). Similarly, the drain of drive transistor DT1 is labeled DT1(D) in FIG. 2a, and this drain is further represented in FIG. 2b as n-type doped region $38_2$ (which is electrically accessible via silicide $42_2$). The doping level of regions $38_1$ and $38_2$ is generally high and, thus, each of regions $38_1$ and $38_2$ is also referred to in the art as an n+ region. Further in FIG. 2a, between the source and drain of drive transistor DT1 is located the gate (i.e., DT1(G)) for that transistor, and which is provided as a part of polysilicon structure $29_1$; further, this gate device is represented in FIG. 2b as polysilicon gate 34 (which is electrically accessible via silicide 44). Having discussed drive transistor DT1 in considerable detail, one skilled in the art should further appreciate how the remaining transistor component legends in FIG. 2a correspond to the schematically illustrated items in FIG. 1b.

Continuing with FIGS. 1b and 2a, one skilled in the art also may appreciate how the layout of FIG. 2a achieves some of the electrical connections shown in FIG. 1b. For example, in FIG. 1b, the drain of drive transistor DT1 is connected to source/drain $S/D_2$ of access transistor AT1. In FIG. 2a, this connection is achieved in that one continuous active region is provided that forms both the drain of drive transistor DT1 and the source/drain $S/D_2$ of access transistor AT1. With respect to another electrical connection, note in FIG. 2a that polysilicon structure $29_1$ extends along the x-dimension such that it not only passes between the source and drain of drive transistor DT1, but it also passes between the source and drain of pull-up transistor PT1. Thus, polysilicon structure $29_1$ achieves what is shown in FIG. 1b as the tied gates of drive transistor DT1 and pull-up transistor PT1. Finally, having discussed various electrical connections achieved in FIG. 2a with respect to drive transistor DT1, access transistor AT1, and pull-up transistor PT1, one skilled in the art should further appreciate the comparable connections illustrated in FIG. 2a with respect to drive transistor DT2, access transistor AT2, and pull-up transistor PT2.

Figure 3A:
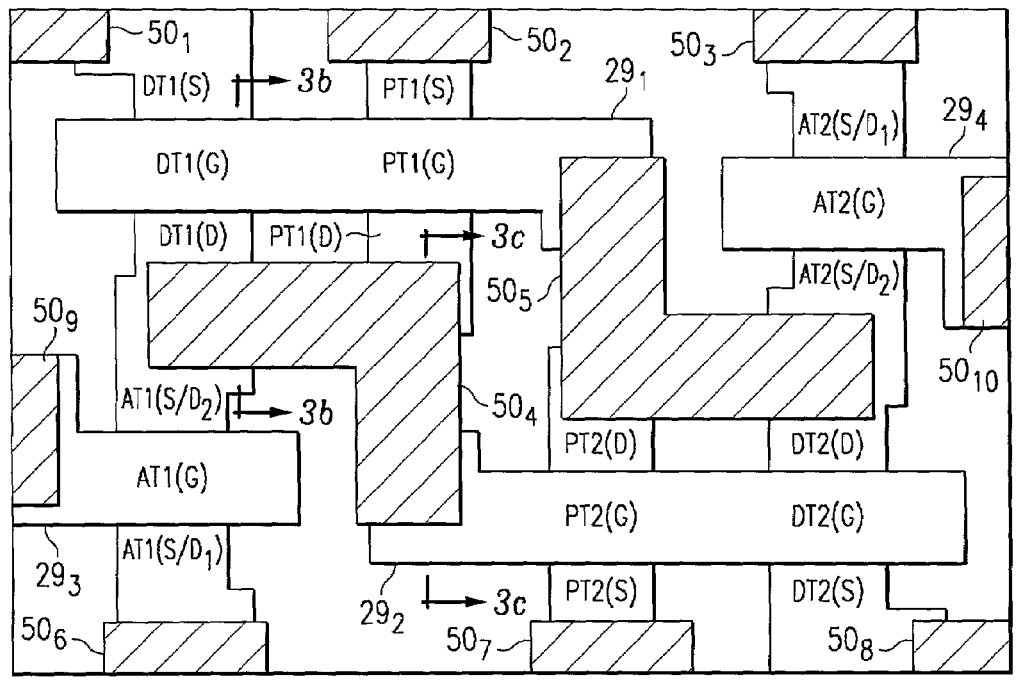
FIG. 3a illustrates a top view of the FIG. 2a prior art 6T SRAM memory cell after the formation of metal_0 plugs.
Figure 3B:
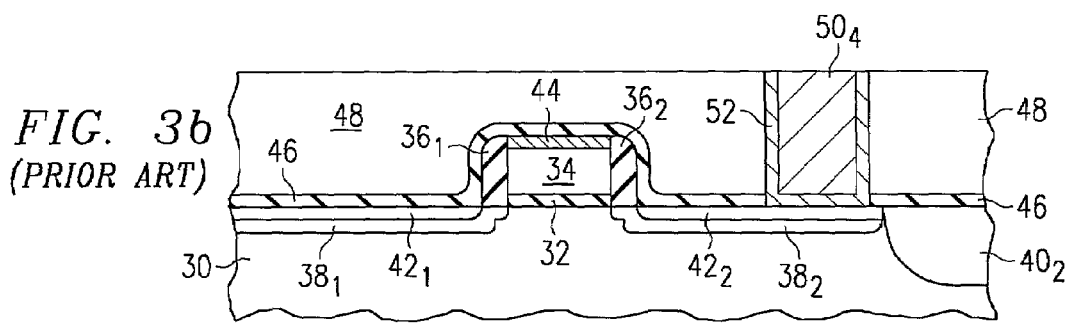
FIG. 3b illustrates a cross-sectional view of a prior art drive transistor shown in FIG. 2b along with a metal_0 plug electrically connecting to the drain of the transistor.
Figure 3C:
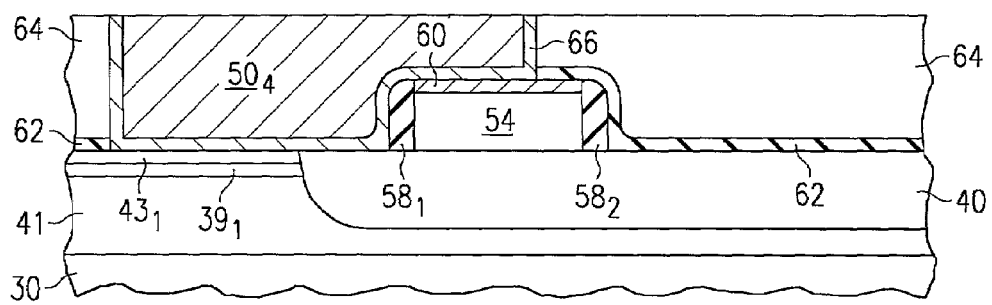
FIG. 3c illustrates a cross-sectional view of a different portion of the metal_0 plug from FIG. 3b wherein the illustrated portion electrically couples to a transistor gate conductor.

FIGS. 3a and 3b illustrate additional fabrication steps for cell $SC_1(WL,C)$, where these steps relate to what is sometimes referred to in the art as the formation of metal damascene plugs. In FIG. 3a, a total of ten metal damascene plugs $50_1$ through $50_{10}$ are formed (shown cross-hatched in FIG. 3a), typically at the same time, and the formation of these metal plugs at this layer is sometimes referred to as the metal__0 layer. The formation of the metal damascene plugs is better understood with reference to FIG. 3b, which illustrates the same general cross-sectional location as FIG. 2b as also shown along the line 3b in FIG. 3a, but due to the additional fabrication steps FIG. 3b also includes a portion of damascene plug $50_4$. Looking then to FIG. 3b and more particularly to the right side of the drawing, a via is formed (e.g., etched) through oxide layer 48 and further through insulating layer 46 until a selected portion of silicide layer $42_2$ is exposed. This via is lined with a titanium nitride layer 52, and the remaining void area is filled with tungsten $50_4$. The total structure is then planarized, such that the remaining combination of tungsten $50_4$ and titanium nitride layer 52 form together what is referred to in the art as a tungsten plug; for sake of reference, therefore, the reference numbers from both tungsten $50_4$ and titanium nitride layer 52 are combined in this document to identify this combination as a tungsten or damascene plug $50_4/52$ when shown in cross-sectional form, although when shown in a top view such as in FIG. 3a or when referred to in general, only the reference number for the tungsten material is used. Further, tungsten plug $50_4/52$ is sometimes referred to as a first (or first layer) plug in that it relates to the metal__0 layer, as further discussed below in connection with FIG. 3c. Given the structure of FIG. 3b, electrical contact may be made to n-type doped region $38_2$ by way of this first tungsten plug $50_4/52$ By way of further background and for purposes of later contrast with respect to the preferred embodiments, additional attention is now given to damascene plugs $50_4$ and $50_5$ in FIG. 3a. Specifically, damascene plug $50_4$ has a portion in the x-dimension and a portion in the y-dimension and, given the above-noted symmetry of cell $SC_1(WL,C)$, damascene plug $50_5$ similarly has portions in both the x- and y-dimensions. The above-discussed FIG. 3b illustrates a cross-sectional view of the x-dimension portion of damascene plug $50_4$; by way of further illustration, however, FIG. 3c illustrates a cross-sectional view of the y-dimension portion of damascene plug $50_4$, as shown along line 3c in FIG. 3a. Looking to FIG. 3c, it illustrates numerous items that are comparable to those discussed above in connection with FIGS. 2b and 3b and, thus, those items are discussed in less detail here yet given different reference identifiers where helpful to distinguish from earlier Figures. Thus, in FIG. 3c, a polysilicon gate 54 is formed above trench isolation oxide region 40, and insulating sidewalls $58_1$ and $58_2$ are formed along the sides of polysilicon gate 54, with a silicide 60 formed over polysilicon gate 54. An n-type well 41 is formed in a selected region within the p-type semiconductor substrate 30 and may be achieved by implanting n-type dopants in that region. A p-typed doped region $39_1$ is formed within well 41, with a silicide $43_1$ formed above region $39_1$. The doping level of region $39_1$ is generally high and is also referred to in the art as a p+ region. An insulating layer 62 such as silicon nitride is formed over silicides $43_1$ and 60 and along insulating sidewalls $58_1$ and $58_2$ and the remaining surface of substrate 30, with an additional insulating layer 64 such as silicon oxide formed over insulating layer 62 and which is then planarized. Thereafter, a via is etched in the area to the left and center of FIG. 3c and through insulating layers 64 and 62 and down to the upper surface of silicides $43_1$ and 60. Next, the via is lined with a titanium nitride layer 66, and the remaining void area is filled with tungsten $50_4$. The total structure is then planarized such that the remaining tungsten forms damascene plug $50_4/52$ and more particularly, where a portion of that plug in the y-dimension is shown in FIG. 3c. Given the structure of FIG. 3c, therefore, electrical contact may be made to polysilicon gate 54 by way of damascene plug $50_4/52$, through the further conductive path formed by silicide 60. The electrical contact is also made to p-typed doped region $39_1$ by way of damascene plug $50_4/52$, through the further conductive path formed by silicide $43_1$. Lastly, recall that the layer of tungsten metal used to form damascene plug $50_4/52$ is sometimes referred to in the art as a metal__0 layer. Thus, this metal__0 layer, as also appreciated from the perspective of FIG. 3a, connects DT1(D), PT1(D), and PT2(G).

Figure 4A:
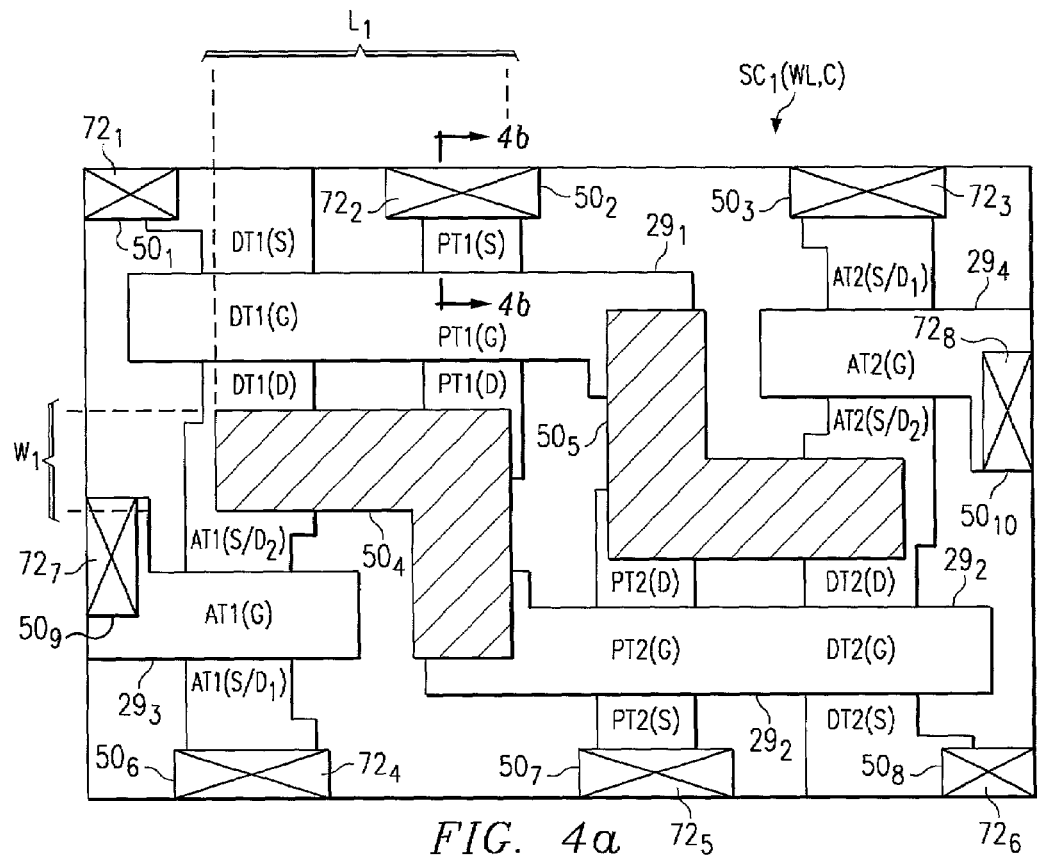
FIG. 4a illustrates a top view of the FIG. 3a prior art 6T SRAM memory cell after the formation of metal_1 contacts.
Figure 4B:
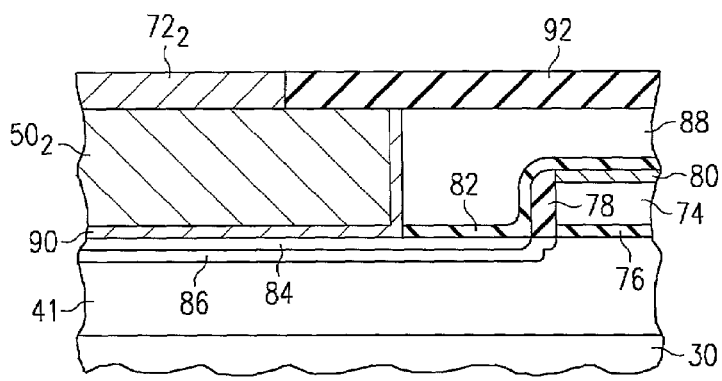
FIG. 4b illustrates a cross-sectional view of the electrical coupling of a metal_1 contact to a metal_0 plug.
Figure 4C:
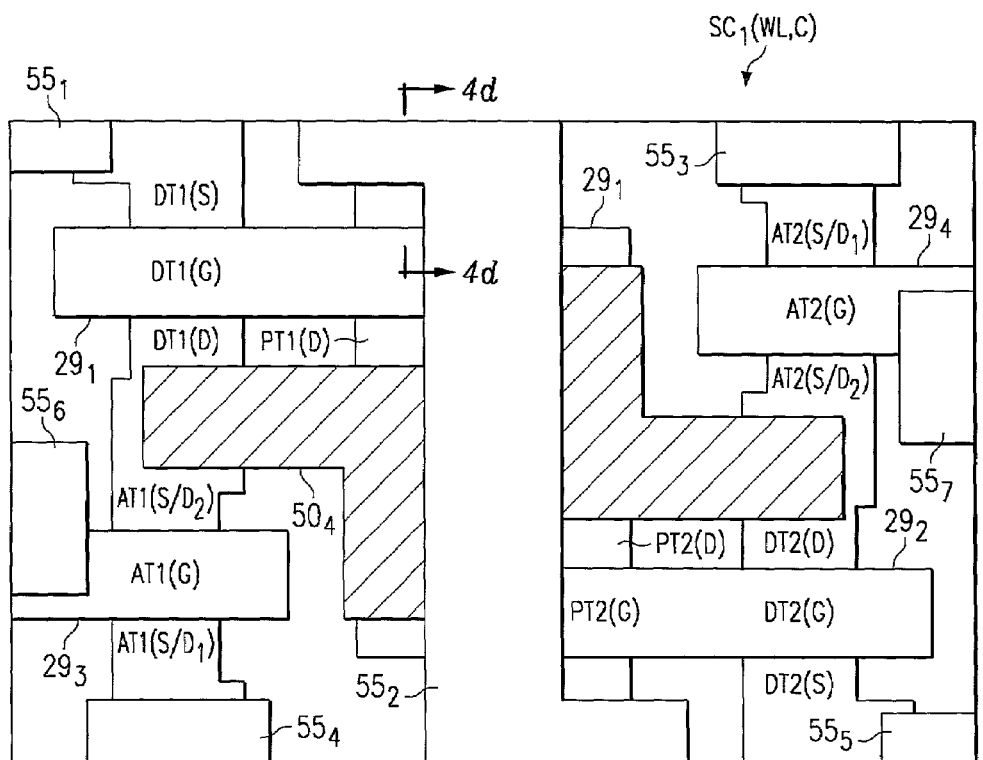
FIG. 4c illustrates a top view of the FIG. 4a prior art 6T SRAM memory cell after the formation of metal_1 elements.
Figure 4D:
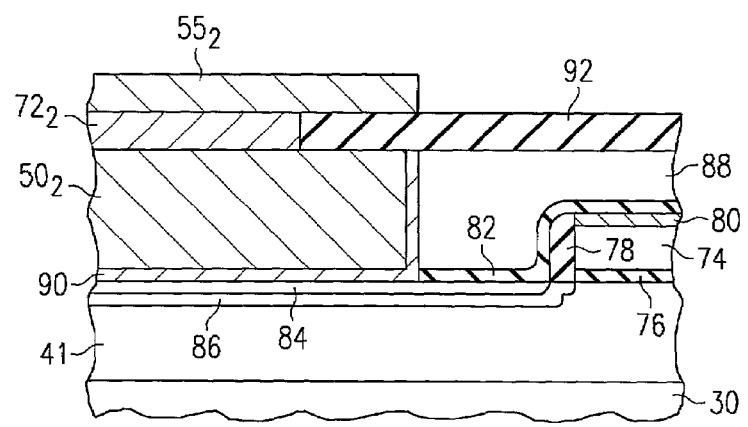
FIG. 4d illustrates a cross-sectional view of the electrical coupling of a metal_1 element to a metal_1 contact.

FIGS. 4a through 4d illustrate additional fabrication steps for cell $SC_1(WL,C)$. By way of introduction, FIGS. 4a and 4b illustrate a first such fabrication step while FIGS. 4c and 4d illustrate a second, and subsequent, fabrication step. Further, the subsequent steps demonstrated by FIGS. 4c and 4d relate to what is sometimes referred to in the art as the formation of the metal__1 layer, while the previous step demonstrated by FIGS. 4a and 4b relate to what is sometimes referred to in the art as the formation of the metal__1 contacts. The FIG. 4a/4b metal__1 contacts are also sometimes referred to as plugs because they are formed by forming a via and then filling the via with a "plug" of metal. In other words, to the extent that damascene plugs $50_1$ through $50_{10}$ described earlier were considered first or first layer plugs, the metal__1 contacts described in connection with FIGS. 4a and 4b may be considered second or second layer plugs. As appreciated further below, these second layer plugs provide an electrical path between the subsequently-formed metal__1 layer and the plugs of the metal__0 layer.

Looking to FIG. 4a, it illustrates a total of eight metal__1 contacts $72_1$ through $72_8$, where each such contact is shown generally with an "X" legend; further, contacts $72_1$ through $72_8$ are formed, typically at the same time, to electrically connect to the underlying metal__0 damascene plugs $50_1$, $50_2$, $50_3$, $50_6$, $50_7$, $50_8$, $50_9$, and $50_{10}$, respectively. The formation of these metal__1 contacts is better understood with reference to FIG. 4b, which illustrates a cross-sectional view along the line 4b in FIG. 4a.

Looking to FIG. 4b, portions of it are comparable to various items described above relative to other Figures. Briefly addressing those items, therefore, a polysilicon gate 74 (corresponding to the gate PT1(G) of pull-up transistor PT1) is separated from n-type well 41 overlying substrate 30 by a gate insulator 76, and polysilicon gate 74 has an insulating sidewall 78 at its side and an overlying silicide 80. An insulating layer 82 such as silicon nitride is formed over silicide 80 and along insulating sidewall 78, and further extends partially over a silicide 84 that is formed over a p-type doped region 86, where p-type doped region 86 represents the source PT1(S) of pull-up transistor PT1 in FIG. 4a. Further, an insulating layer 88, such as silicon oxide, is formed over insulating layer 82; however, both insulating layers 88 and 82 have been etched to form a via which is lined by a titanium nitride layer 90 followed by a fill with tungsten $72_2$, thereby forming tungsten damascene plug $50_2/90$ (i.e., a metal_0 plug).

Looking to the remaining items in FIG. 4b, they represent the completion of the metal_1 contacts as represented by metal_1 contact $72_2$. More particularly, after the formation of damascene plug $50_2/90$ and planarization thereof, an additional insulating layer (e.g., oxide) 92 is formed over insulating layer 88 and damascene plug $50_2/90$, and a via is formed in insulating layer 92 to expose the top of damascene plug $50_2/90$. This via is also filled with tungsten and/or other conducting layers and again planarized, thereby forming metal_1 contact $72_2$; from this description as well as the perspective of FIG. 4b, it now may be appreciated that metal_1 contact $72_2$ (and the other metal_1 contacts $72_1$ and $72_3$ through $72_8$ of FIG. 4a formed at the same time) may be referred to as a second (or second layer) conducting plug in contrast to the first (or first layer) plugs that consist of the metal_0 layer damascene plugs.

Looking to FIG. 4c, and as introduced above, it illustrates the formation of the metal_1 layer following the formation of the metal_1 contacts of FIG. 4a. Specifically, in FIG. 4c, the metal_1 layer has formed a total of seven metal_1 layer elements $55_1$ through $55_7$, where each such element is formed at the same time and electrically connects to one or more underlying metal_1 contacts, where such connections are summarized in the following Table 1:

TABLE 1

| Metal_1 layer element | Metal_0 contact(s) |
|---|---|
| $55_1$ | $72_1$ |
| $55_2$ | $72_2$ and $72_5$ |
| $55_3$ | $72_3$ |
| $55_4$ | $72_4$ |
| $55_5$ | $72_6$ |
| $55_6$ | $72_7$ |
| $55_7$ | $72_8$ |

From Table 1 and FIG. 4c, it may be appreciated that each illustrated metal_1 layer element other than element $55_2$ connects to a single corresponding and underlying metal_0 contact, while element $55_2$ connects to two underlying metal_1 contacts (i.e., $72_2$ and $72_5$).

The formation of metal_1 layer elements from FIG. 4c is also further illustrated in FIG. 4d which provides a cross-sectional view along the line 4d in FIG. 4c, and which therefore illustrates metal_1 layer element $55_2$ as an example of each of the comparably-formed metal_1 layer elements. Specifically, after the formation of the components in FIG. 4b, as carried forward to FIG. 4d, an aluminum layer is formed and patterned on top of insulating layer 92. The resulting portion of this aluminum layer is metal_1 layer element $55_2$, and at the same time the aluminum forms the other metal_1 layer elements $55_1$ and $55_3$ through $55_7$. The metal_1 layer elements are also sometimes referred to in the art as an interconnect because they may electrically connect two or more metal_1 contacts to one another, that is, the metal_1 layer includes at least some elements that extend in a planar fashion parallel to the underlying substrate and between two or more metal_1 contacts. Lastly, note that some modern circuits use copper to form what is identified above as both metal_1 contacts and metal_1 layer elements. In this case, after the formation of insulating layer 92 a first mask is used to etch a vertical via through insulating layer 88, and then a second mask is used to etch the horizontal lines along which the copper will run in parallel to substrate 30; thereafter, copper is formed within the voids created by the two mask steps. Thus, in the copper process, a second layer of plugs is not formed, but nevertheless two different masks and corresponding masking steps are required, a first to form vertical vias and as second to form horizontal lines in which the copper is subsequently located. Further in this regard, there also are prior art copper formation schemes in which horizontal lines are formed first and vertical vias are formed second.

Having now detailed the prior art cell $SC_1(WL,C)$ and its formation, the present inventor has recognized at least two of its drawbacks which are now described. With respect to a first drawback, note in FIG. 4a that two distances are identified with respect to the x-dimension portion of damascene plug $50_4$, namely, a length $L_1$ in the x-dimension and a width $W_1$ in the y-dimension, where length $L_1$ is larger than width $W_1$. Given these distances, one drawback of cell $SC_1(WL,C)$ arises from the patterning and etch of the via to form damascene plug $50_4$. More particularly, when this patterning and etch occur, and due to the fact that $L_1$ is considerably larger than W, then the etch will tend to bulge toward the center of $L_1$ so that the resulting via curves convexly. As a result, because as shown in FIG. 4a the length $L_1$ of damascene plug $50_4$ is generally parallel to polysilicon structure $29_1$, then the actual shape of the via, and the tungsten damascene plug $50_4$ formed in that via, will bulge toward the center of length $L_1$ and in the direction towards polysilicon structure $29_1$ in a convex manner not expressly shown in the Figure. Further, because damascene plug $50_4$ and polysilicon structure $29_1$ are proximate to one another in the same plane, then if the bulge in plug $50_4$ extends far enough such that the tungsten contacts polysilicon structure $29_1$, and since polysilicon structure $29_1$ forms a gate conductor for both drive transistor DT1 and pull-up transistor PT1, then this curvature of the via can short circuit damascene plug $50_4$ to polysilicon structure $29_1$. Clearly, such a result is undesirable and reduces the process margin. Further, in an effort to avoid such an occurrence, the formation of the via to maintain the required parallelism between the x-dimension portion of damascene plug $50_4$ and polysilicon structure $29_1$ requires very complex optical proximity correction to maintain the critical dimension for damascene plug $50_4$. Lastly, due to the symmetry of cell $SC_1(WL,C)$, the same problem just-described as between the x-dimension portion of damascene plug $50_4$ and polysilicon structure $29_1$ also occurs as between damascene plug $50_5$ and polysilicon structure $29_2$. As a second drawback, attention is returned to FIG. 4d. From this Figure, recall for cell $SC_1(WL,C)$ that any electrical connection between metal_1 and a metal_0 plug (e.g., $50_2$) is achieved in the prior art 6T cell by four steps, namely: (1) forming an additional insulating layer 92; (2) forming a via in that layer; (3) filling the via with a metal_1 contact $72_2$; and (4) providing a final electrical connection by a metal_1 layer portion $55_2$. These steps therefore require fabrication steps including masking which may considerably affect the overall fabrication cost. To the contrary, the preferred embodiments described below provide a small aspect ratio 6T cell that reduces the effects of the prior art drawbacks and thereby improve upon the prior art.

Figure 5A:
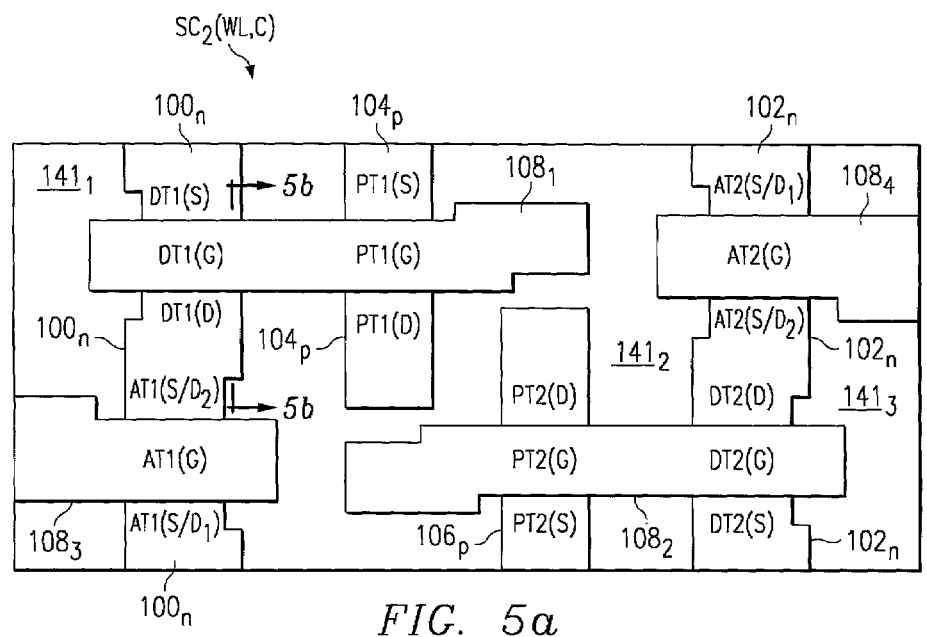
FIG. 5a illustrates a top view of the layout of a 6T SRAM memory cell according to the preferred inventive embodiment.

FIG. 5a illustrates a top view of a semiconductor device cell structure that may be used for the cells in memory configuration 20 according to the preferred inventive embodiment, and by way of reference the FIG. 5a cell is shown generally as $SC_2(WL,C)$. In FIG. 5a, several of the steps of fabrication of the semiconductor device have been completed and are shown, while others are not shown to simplify the Figure or are discussed below in connection with additional formation steps. Cell $SC_2(WL,C)$ is formed in connection with an underlying semiconductor substrate not directly visible in the perspective of FIG. 5a, and by way of example let this semiconductor substrate be a p-type substrate. Looking further to FIG. 5a, it illustrates two additional region layers in connection with or overlying that substrate, each of which is discussed below.

In FIG. 5a, a first n-channel active region $100_n$ and a second n-channel active region $102_n$ are formed generally in the y-dimension in cell $SC_2(WL,C)$, that is, along the direction of the bit lines which are not shown but also which are understood to be in this same direction. Second n-channel active region $102_n$ is symmetric with respect to first n-channel active region $100_n$, but region $102_n$ is flipped with respect to region $100_n$. Each of n-channel active regions $100_n$ and $102_n$ is a continuous region along cell $SC_2(WL,C)$, yet the continuity of each region is not directly visible in FIG. 5a due to the additional layers formed over those continuous regions. Toward the left middle of cell $SC_2(WL,C)$, a first p-channel active region $104_p$ is formed along the y-dimension, but p-channel active region $104_p$ does not extend the full length of cell $SC_2(WL,C)$. A second p-channel active region $106_p$ is also formed along the y-dimension of $SC_2(WL,C)$ but to the right middle of the cell, and it too does not extend the full length of cell $SC_2(WL,C)$. Second p-type region $106_p$ is symmetric with respect to first p-channel active region $104_p$, and region $106_p$ is flipped with respect to region $104_p$. Both p-channel active regions $104_p$ and $106_p$ are preferably formed over an n-type well within the p-type semiconductor substrate. Preferably, each of active regions $100_n$, $102_n$, $104_p$, and $106_p$ is formed at the same time and is physically isolated from each other by trench oxide isolation regions $141_1$, $141_2$, and $141_3$. Further, portions of regions $100_n$, $102_n$, $104_p$, and $106_p$ form different source/drains for the various six transistors in cell $SC_2(WL,C)$, as shown by reference identifiers in FIG. 5a, and which should be readily understood due to the comparable location of these regions to those discussed earlier in connection with the prior art. Completing FIG. 5a, also illustrated are four polysilicon structures $108_1$ through $108_4$. Polysilicon structures $108_1$ through $108_4$ are formed at the same time using appropriate patterning and are shaped such the majority of each of those structures is formed in the x-dimension, that is, along the direction of the word lines which are not shown but also which are understood to be in this same direction (i.e., perpendicular to the above-discussed y-dimension for bit lines). Further, each of the polysilicon structures $108_1$ through $108_4$ overlies one or more active regions and operates as a transistor gate as further discussed below. Polysilicon structures $108_2$ and $108_4$ are symmetric, but flipped, with respect to polysilicon structures $108_1$ and $108_3$, respectively. Lastly, note that cell $SC_2(WL,C)$ as illustrated in FIG. 5a, like cell $SC_1(WL,C)$ described earlier, is a small aspect ratio SRAM cell due to the continuous active regions in the y-dimension, the polysilicon structures primarily in the x-dimension, and the symmetric and flipped nature of the cell which typically results in a cell size which is much longer in the direction of the word lines as compared to the length in the direction of the bit lines.

Figure 5B:
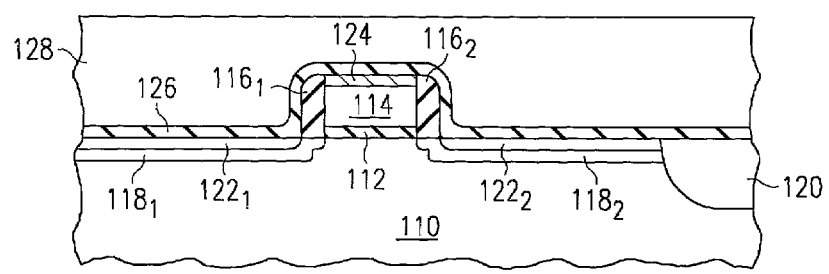

FIG. 5b illustrates a cross-sectional view of cell $SC_2(WL,C)$ along the line indicated at 5b in FIG. 5a, and illustrates from a cross-sectional view that at this point in the fabrication process cell $SC_2(WL,C)$ appears in the same manner as cell $SC_1(WL,C)$ discussed above in connection with FIG. 2b. Thus, given that the reader is assumed familiar with the previous discussion, FIG. 5b is now reviewed in brief fashion. A substrate (e.g., p-type) 110 is shown, with a gate insulator 112 formed above substrate 110 and a polysilicon gate 114 formed above gate insulator 112. Insulating sidewalls $116_1$ and $116_2$ are formed along the sides of polysilicon gate 114. Two separate n-type doped regions $118_1$ and $118_2$ are formed in substrate 110 and extend under the sides of insulating sidewalls $116_1$ and $116_2$, respectively, and n-type doped regions $118_1$ and $118_2$ are further isolated by trench isolation oxide 120. Above each of n-type doped regions $118_1$ and $118_2$ is formed a respective silicide region $122_1$ and $122_2$. A silicide layer 124 is formed above polysilicon gate 114, and an insulating layer 126, such as silicon nitride, is formed over silicide layer 124 as well as over isolation region 120, silicide regions $122_1$ and $122_2$ and over the rest of substrate 110. Lastly, an oxide layer 128 (e.g., silicon oxide) is formed over insulating layer 126, and is planarized as shown in FIG. 5b.

From FIGS. 5a and 5b, and given the preceding discussion of the prior art, one skilled in the art may further appreciate how the layout of FIG. 5a depicts various of the device components shown in FIG. 1b. Thus, without an extensive detailed discussion, it should be readily recognized that first n-channel active region $100_n$ provides the source/drain regions for both drive transistor DT1 and access transistor AT1, while the gates to those transistors are provided by polysilicon structures $108_1$ and $108_3$, respectively. Similarly, second n-channel active region $102_n$ provides the source/drain regions for both drive transistor DT2 and access transistor AT2, while the gates to those transistors are provided by polysilicon structures $108_2$ and $108_4$, respectively. Finally, first p-channel active region $104_p$ provides the source/drain regions for pull-up transistor PT1 with its gate being provided for by polysilicon structure $108_1$, while second p-channel active region $106_p$ provides the source/drain regions for pull-up transistor PT2 with its gate being provided for by polysilicon structure $108_2$. Lastly, some of the electrical connections from FIG. 1b are achieved in FIG. 5a due to mutual active regions, such as the same active region used as drain D for drive transistor DT1 and source/drain $S/D_2$ for access transistor AT1, and the same active region used as drain D for drive transistor DT2 and source/drain $S/D_2$ for access transistor AT2. Additionally, other connections are achieved by mutual use of the polysilicon structures. Specifically, polysilicon structure $108_1$ connects the gate of drive transistor DT1 to the gate of pull-up transistor PT1, and polysilicon structure $108_2$ connects the gate of drive transistor DT2 to the gate of pull-up transistor PT2. Additional electrical connections are achieved with additional layers, as discussed below.

Figure 6:
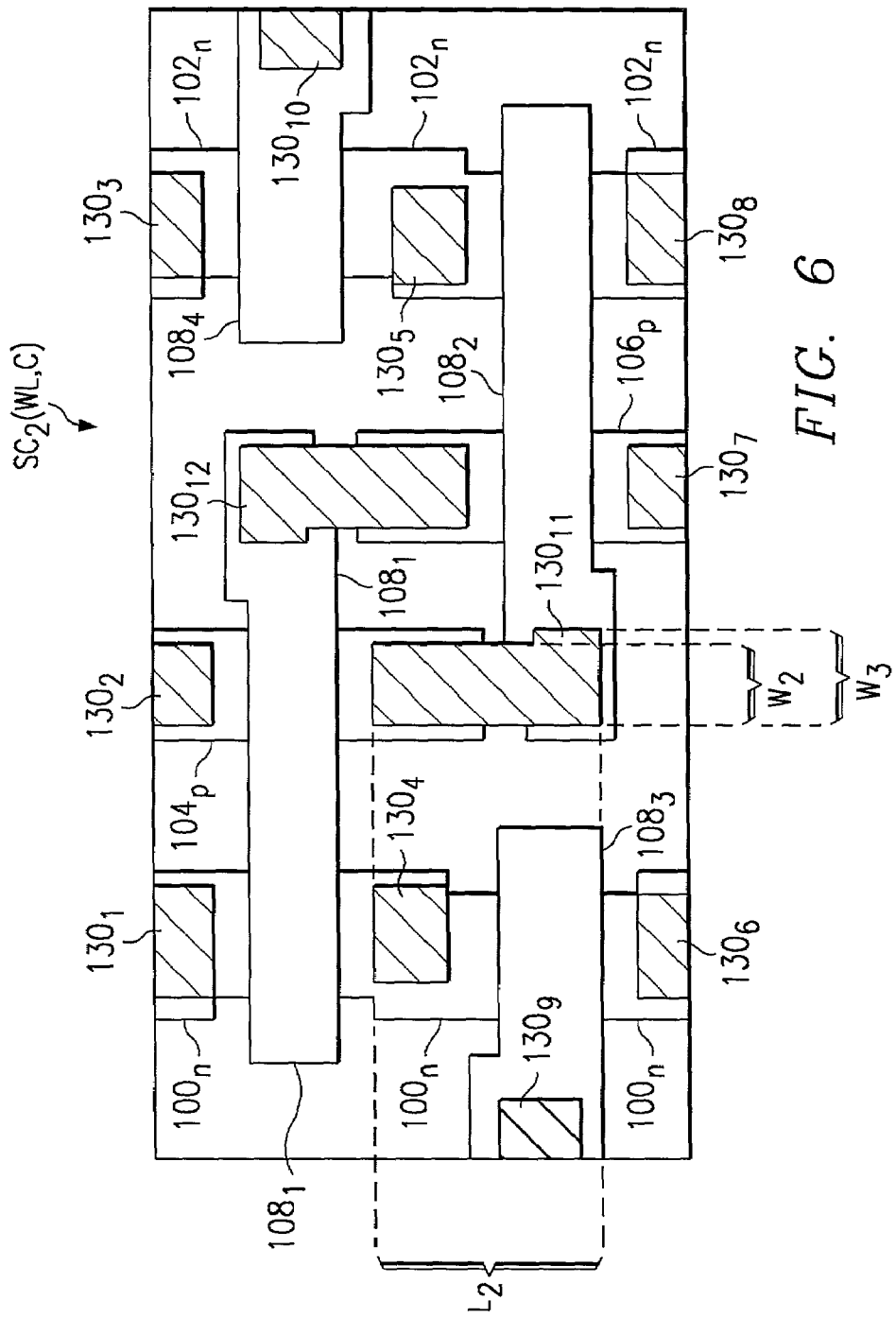
FIG. 6 illustrates a top view of the FIG. 5 6T SRAM memory cell after the formation of metal_0 plugs.

FIG. 6 illustrates an additional fabrication step for cell $SC_2(WL,C)$ and relates to the formation of damascene plugs. In FIG. 6, a total of twelve damascene plugs $130_1$ through $130_{12}$ are formed (shown cross-hatched in FIG. 6), preferably at the same time, and are referred to as the metal_0 layer. The formation of these metal_0 plugs in certain respects is the same as the "first" plugs discussed above in connection with the prior art; thus, in the present case, a via is formed (e.g., etched) through any insulating layers between the top of the device and the active or polysilicon gate regions to which the plug will electrically connect; for example with respect to FIG. 5b, the via is etched through layers 128 and 126, until a selected portion of a desired silicide layer (e.g., $122_1$ or $122_2$) is exposed. This via is lined with a titanium nitride layer and the remaining void area is filled with tungsten. The total structure is then planarized, such that the remaining tungsten forms each of plugs $130_1$ through $130_{12}$. These fabrication steps are also further appreciated later in connection with FIGS. 7a and 7b.

Also with attention to plugs $130_1$ through $130_{12}$ of FIG. 6, and for reasons discussed in greater detail below, note that each plug in a first set of plugs, namely, plugs $130_1$ through $130_{10}$, provides electrical contact to only a single underlying region; in contrast, each plug in a second set of plugs, namely, plugs $130_{11}$ and $130_{12}$, couples at least two different and isolated regions to one another. As an example of the first set, plug $130_1$ provides electrical contact to the source DT1(S) of drive transistor DT1. As an example of the second set, plug $130_{11}$ provides electrical contact to both the drain PT1(D) of pull-up transistor PT1 and to the gates PT2(G) and DT2(G) of pull-up transistor PT2 and drive transistor DT2, respectively. Accordingly, such a plug is referred to in this document as a "stretch" or "stretched" plug given its ability to bridge between two regions that are otherwise electrically isolated from one another. Additional details of a use of a stretched tungsten plug and an overlying patterned metal also may be found in U.S. patent application Ser. No. 09/311,502, entitled "Apparatus and Method for Metal Layer Stretched Conducting Plugs," filed May 13, 1999, and hereby incorporated herein by reference.

Figure 7A:
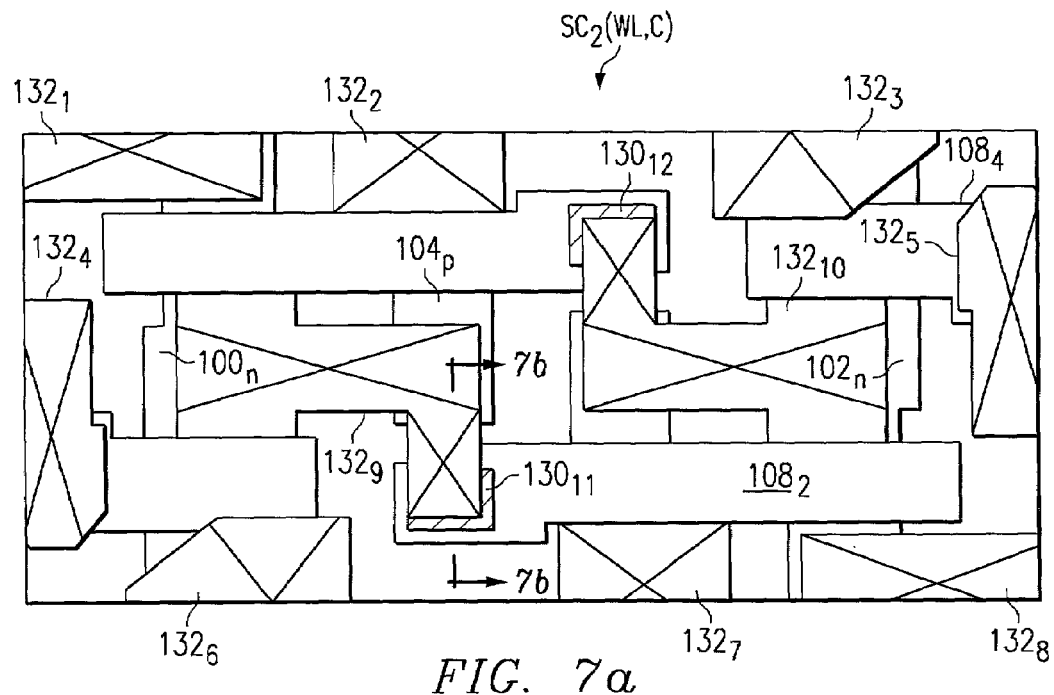
FIG. 7a illustrates a top view of the FIG. 6 6T SRAM memory cell after the formation of metal_1 elements.
Figure 7B:
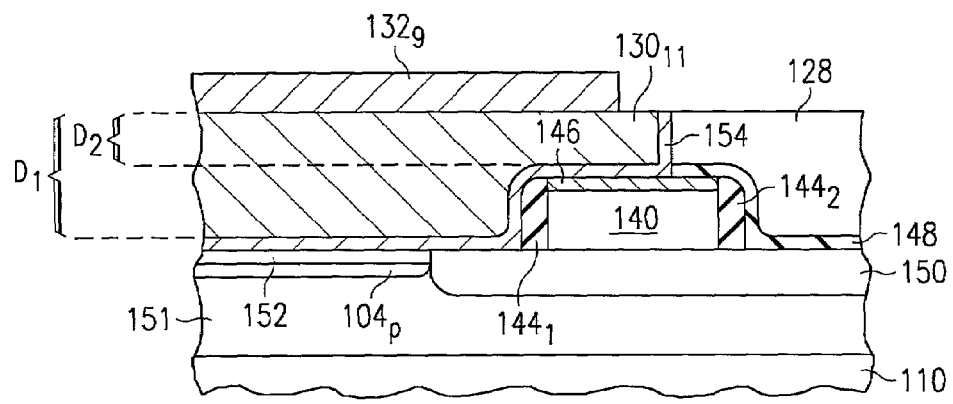
FIG. 7b illustrates a cross-sectional view of the electrical coupling whereby a metal_1 element physically touches a metal_0 element.

FIGS. 7a and 7b illustrate additional fabrication steps for cell $SC_2(WL,C)$ to form the metal_1 layer for the cell in the preferred embodiment. In FIG. 7a, a total of ten metal_1 elements $132_1$ through $132_{10}$ are formed, where each such element is shown generally with an "X" legend. Each element $132_1$ through $132_{10}$ physically touches one or more of the underlying metal_0 damascene plugs $130_1$ through $130_{12}$. Thus, in contrast to the prior art 6T SRAM shown in FIGS. 4a through 4d where each of its metal_1 elements physically touches one or more metal_1 contacts and that each metal_1 contact physically touches only one underlying metal_0 plug, in the preferred embodiment some of the metal_1 elements physically touch more than one metal_0 plug, as further illustrated below. This contrast improves the overall layout of cell $SC_2(WL,C)$ as further explored below. Elements $132_1$ through $132_{10}$ are preferably formed at the same time, and the specific formation of these elements is better understood with reference to FIG. 7b, which illustrates a cross-sectional view along the line 7b in FIG. 7a. Before detailing FIG. 7b, note that each of metal_1 elements $132_1$ through $132_8$ physically touch an underlying and corresponding metal_0 plug as that term is defined above, where each of those metal_0 plugs electrically communicates with only a single component. Conversely, metal_1 elements $132_9$ and $132_{10}$ each physically touch at least two underlying metal_0 plugs. For example, element $132_9$ physically touches two metal_0 damascene plugs, namely, plug $130_{11}$ as shown in FIG. 7a, and plug $130_4$ which is not visible in the FIG. 7a perspective but which is readily understood from the illustration of FIG. 6. As another example, metal_1 element $132_{10}$ physically touches two metal_0 damascene plugs, namely, plugs $130_{12}$ and $130_5$.

Looking to FIG. 7b, portions of it are comparable to various items described above relative to other Figures. Briefly addressing those items, therefore, a polysilicon gate 140 (corresponding to polysilicon structure $108_2$) is over an n-type well 151 and is separated from substrate 110 by isolation region 150, and polysilicon gate 140 has insulating sidewalls $144_1$ and $144_2$ along its sides as well as an overlying silicide 146. An insulating layer 148 such as silicon nitride is initially formed entirely over silicide 146 and along insulating sidewalls $144_1$ and $144_2$ and along the surface of substrate 110 and isolation region 150, but at the point of fabrication in FIG. 7b the portion of insulating layer 148 generally from the middle of FIG. 7b to the left has been etched and removed to form plug $130_{11}/154$ as further detailed later; indeed, also formed over insulating layer 148 (and planarized) prior to the formation of metal_0 damascene plug $130_{11}/154$ is insulating layer 128, but layer 128 also has been removed generally from the middle of FIG. 7b to the left. Also shown in FIG. 7b is a p-type doped region representing one end of first p-channel active region $104_p$ of FIG. 6. A silicide 152 is formed over first p-channel active region $104_p$.

Completing FIG. 7b, attention is now directed to the formation of metal_0 damascene plug $130_{11}/154$ and the layers relating to it, and one skilled in the art should appreciate that the following discussion also relates in general to the formation of the other metal_0 damascene plugs $130_1$ through $130_{10}$ and $130_{12}$. As described earlier in connection with FIG. 6, plug $130_{11}/154$ is formed by first etching a via through any insulating layers between the top of the overall device and the active and/or polysilicon region(s) to which the plug will electrically connect; for the example in FIG. 7b, therefore, the etch is through insulating layers 128 and 148 to thereby expose silicides 146 and 152. This via is lined with a titanium nitride layer 154 and the remaining void area is filled with tungsten $130_{11}$, thereby completing damascene plug $130_{11}/154$. Next, plug $130_{11}/154$ (and the other plugs $130_1$ through $130_{10}$ and $130_{12}$ formed at the same time as plug $130_{11}$) and insulating layer 128 are planarized. Thereafter, a metal layer, preferably aluminum or copper, is formed and patterned to create metal_1 element $132_9$ (as well as the other metal_1 elements $132_1$ through $132_8$ and $132_{10}$ shown in FIG. 7a). Thus, the shape of element $132_9$ is therefore determined by the pattern used for the formation of that and the other metal_1 elements. Further, the particular shape of element $132_9$ (and element $132_{10}$) gives rise to a preferred orientation with respect to other components in cell $SC_2(WL,C)$. However, the shape of the other metal_1 elements $132_1$ through $132_8$ may vary according to various implementation details ascertainable by one skilled in the art.

The perspective of FIG. 7b also demonstrates that metal_1 element $132_9$ physically touches an underlying metal_0 plug $130_{11}/154$, and may be contrasted to the physical configuration of the prior art. Specifically, in the preferred embodiment there is no intermediate metal_1 contact between the metal_1 element and the metal_0 plug. As also shown in FIG. 7b, in the preferred embodiment there is no insulating layer between metal_1 element $132_9$ and metal_0 plug $130_{11}/154$. This present inventor has found this elimination as acceptable in the preferred embodiment because the subsequently formed metal_1 elements are typically routed within cell SC2(WL,C) and, thus, there is not a large concern of avoiding metal_0 layer elements. Further, in another sense of characterizing the configuration difference between the preferred embodiment and the prior art, note in FIG. 7b that a distance D is defined as the height of metal_0 plug $130_{11}$, that is, at any vertical reference point D is the distance from its upper surface to its lower surface. Further, two such distances $D_1$ and $D_2$ are shown in FIG. 7b because the lower surface of metal_0 plug $130_{11}$ toward the left in FIG. 7b is adjacent silicide 152 thereby defining a distance $D_1$ to the upper surface of metal_0 plug $130_{11}$ at that vertical location, and the lower surface of metal_0 plug $130_{11}$ toward the right in FIG. 7b is adjacent silicide 146 thereby defining a distance $D_2$ to the upper surface of metal_0 plug $130_{11}$ at that vertical location. For either such distance $D_1$ or $D_2$ (i.e., at either vertical location), when metal_1 element $132_9$ is formed according to the preferred embodiment, the distance at a given vertical location between the horizontal plane defined by its lower surface (i.e., and parallel to substrate 110) and the bottom (i.e., lower) surface of metal_0 plug $130_{11}$ is equal to or less than the distance D. In contrast, under the prior art such as shown in FIG. 4d, the distance between the horizontal plane defined along the lower surface of metal_1 element $55_2$ and the bottom surface of metal_0 plug $50_2/90$ is greater than the height of metal_0 plug $50_2$. Further, if copper were implemented in FIG. 4d, it would require an additional thickness of insulating material above metal_0 plug $50_2/90$ and would then form a primarily horizontal layer with vertical extensions projecting downward toward to contact metal_0 plug $50_2/90$. However, also in this case of a copper implementation, then if an imaginary plane is defined along the bottom of the primarily horizontal layer of the metal_1 copper layer and extended over each vertical extension, then the distance from that imaginary plane to the lower surface of metal_0 plug $50_2/90$ (proximate substrate 30 or well 41 formed therein) would be greater than the height of metal_0 plug $50_2/90$. Indeed, note finally that in an alternative preferred embodiment, some type of surface treatment may be made to insulating layer 128 prior to the formation of metal_1 element $132_9$, but because this approach is merely a treatment as opposed to the formation of another layer, then the top of metal_0 plug $130_{11}/154$ remains exposed even after such a treatment; accordingly, in this alternative, metal_1 element $132_9$ may still be formed next and will touch metal_0 plug $130_{11}/154$ and once more metal_1 element $132_9$ would be at a distance no greater than $D_1$ or $D_2$ (depending on the vertical position considered) from the lower surface of metal_0 plug $130_{11}/154$.

Having detailed the formation of the metal_1 elements according to the preferred embodiment, the process of forming those elements also may be compared to the description of the prior art metal_1 elements provided above with respect to FIG. 4d. Specifically, the preferred embodiment eliminates the need for an additional insulating (e.g., oxide) layer shown as insulating layer 92 in FIG. 4d and its associated second conducting plug shown as metal_1 contact $72_2$ in FIG. 4d. Consequently, the additional method steps associated with the eliminated structures, which include at least an additional mask and masking operation to form vias in insulating layer 92 (as well as a possible step of a tungsten fill to form metal_1 contact $72_2$), are not required by the preferred embodiment. Stated alternatively, in the prior art, at least three masks and masking operations are required to complete the structure through the point of metal_1 element formation as illustrated in FIG. 4d, namely: (1) a first mask to form a via through insulating layers 88 and 82; (2) a second mask to form a via through layer 92; and (3) a third mask used to form metal_1 element $55_2$ (either to remove metal if aluminum is used to form metal_1 element $72_2$ or to define planar voids, parallel to substrate 30, that are to be filled if copper is used to form metal_1 element $72_2$). In contrast, the preferred embodiment implements only two masks and masking operations to complete the structure through the point of metal_1 element formation as illustrated in FIG. 7b, namely: (1) a first mask to form a via through insulating layers 128 and 148; and (2) a second mask used to form metal_1 element $132_9$ (either to remove metal if aluminum is used to form metal_1 element $132_9$ or to define planar voids, parallel to substrate 110, that are to be filled if copper is used to form metal_1 element $132_9$). In other words, in the preferred embodiment, a first mask is used to form the via so that a metal_0 plug may be formed therein, while the next successive masking operation is used to form the metal_1 elements (e.g., element $132_9$) without any intermediate mask(s) used between those two masks.

To further appreciate an improvement of the preferred embodiment versus the prior art, note now the difference of the preferred embodiment in its electrical connection as relating to the three transistors relating to each inverter in cell $SC_2(WL,C)$. For example, recalling that a first such inverter and its output node relates to access transistor AT1, pull-up transistor PT1, and drive transistor DT1, the mutual drains of the like conductivity type (e.g., n-type) transistors relating to that inverter communicate with a tungsten damascene metal_0 plug $130_4$, while the drain of the of the opposite conductivity type transistor in that inverter (i.e., pull-up transistor PT1) communicates with a stretched damascene metal_0 plug $130_{11}$ that cross-couples to the gates of the transistors in the other inverter. Further, a metal_1 element $132_9$ then includes a portion in the x-dimension that electrically ties all of these items together. Indeed and by way of further contrast to the prior art, the preferred embodiment as reflected in FIG. 6 may be compared to the prior art as shown in FIG. 4a. Given this comparison, note that the preferred embodiment approach eliminates the horizontal portion of a tungsten plug as used in the prior art and that parallels the gate polysilicon structure $29_1$. In other words, in the preferred embodiment, there is not a tungsten plug having a dimension on the order of the dimension $L_1$ that along the same plane is parallel to and proximate polysilicon structure $29_1$ as described relative to FIG. 4a; instead, the majority of the area of plug $130_{11}$ is primarily perpendicular to polysilicon structure $108_1$, meaning that the longest dimension of plug $130_{11}$, shown in FIG. 6 as a length $L_2$, is generally perpendicular to polysilicon structure $108_1$. Further in this regard, length $L_2$ is preferably at least 1.5 times greater than width $W_2$ and, indeed, may be more on the order of two to three times greater than width $W_2$. In any event, any bulge that could occur during the etch of the via to form plug $130_{11}$ will be along length $L_2$ and, hence, will not be in the direction of a gate conductor, from which it must be isolated; accordingly, any such bulge will not pose a risk of a short circuit to a nearby gate conductor as is the case in the prior art. Consequently, device yield is considerably improved using the preferred embodiment. Moreover, as shown in FIG. 7b, the electrical connection provided by metal_1 element $132_9$ in the y-dimension is at a different (i.e., higher) plane than that shared by polysilicon gate 140 and $130_{11}/154$. Finally, note also as shown in FIG. 6 that in the preferred embodiment plug $130_{11}$ does include a portion having a width $W_3$ in the x-dimension that is slightly larger than width $W_2$ and which is preferable to increase plug area and reduce contact resistance; however, the portion of plug $130_{11}$ having width $W_3$ is not proximate polysilicon gate $108_1$ and, thus, any bulge in this area of the plug is not expected to impact the shape of plug $103_{11}$ near polysilicon gate $108_1$.

Given the symmetric nature of cell $SC_2(WL,C)$, the observations made above with respect to plug $130_{11}$ also may be made with respect to plug $130_{12}$ and its spatial relationship to polysilicon structure $108_2$. Thus, the majority of the area of plug $130_{12}$ is primarily perpendicular to polysilicon structure $108_2$, meaning that the majority of the length of plug $130_{12}$ is perpendicular to the majority of the length of polysilicon structure $108_2$ and plug $130_{12}$ does not include a portion that is considerably larger than the width $W_2$ and that is proximate and parallel to polysilicon structure $108_2$ along the same plane.

From the above, it may be appreciated that the above embodiments provide an improved memory with 6T small aspect ratio cells having stretched plug electrical couplings in the metal_0 layer, and at least one metal_1 element physically contacting more than one metal_0 plug and without the need of a metal_1 contact between the metal_1 element and the metal_0 plug. Further, while the present embodiments have been described in detail, various substitutions, modifications or alterations could be made to the descriptions set forth above without departing from the inventive scope. For example, the substrate in an alternative embodiment may be formed from silicon or any other suitable material. As another example, the isolated conducting regions within the 6T cell and coupled together by a stretched plug can be implanted regions, diffused regions, gate regions, silicided diffused regions, silicided gates and metal regions or combinations thereof. As still another example, the material used to form a stretched plug may be comprised of at least one conducting material selected from the group that includes titanium, titanium nitride, tungsten, aluminum, and copper. Further, patterned elements in the metal_1 layer also may be comprised of at least one conducting material selected from the group that includes titanium, titanium nitride, tungsten, aluminum, and copper. As still another example, planarization of specified layers can be accomplished by various techniques, for example, by chemical mechanical polishing, by an etch-back process, and the like. As a final example, while the preferred embodiment illustrates certain metal_1 elements connected to more than one metal_0 plug, in alternative embodiments these connections may be altered such that other metal_1 elements connected to more than one other metal_0 plug. Thus, from the preceding teachings one skilled in the art will appreciate that the inventive scope has considerable flexibility, as further demonstrated by the following claims.

The invention claimed is:

1. A method of forming a memory circuit comprising a plurality of six transistor memory cells, comprising the steps for each of the six transistor memory cells of:
    forming a first inverter having an input and an output, and comprising:
        a first transistor forming a first drive transistor comprising first and second source/drain regions and a gate;
        a second transistor forming a first pull-up transistor comprising first and second source/drain regions and a gate;
    wherein the output of the first inverter is coupled to the first source/drain region of the first drive transistor and to the first source/drain region of the first pull up transistor;
    forming a second inverter having an input and an output, and comprising:
        a third transistor forming a second drive transistor comprising first and second source/drain regions and a gate;
        a fourth transistor forming a second pull-up transistor comprising first and second source/drain regions and a gate;
    wherein the output of the second inverter is coupled to the second source/drain region of the second drive transistor and to the first source/drain region of the second pull up transistor;
    forming a fifth transistor forming a first access transistor having a gate and having a first source/drain region coupled to the output of the first inverter and a second source/drain region for communicating to a first bit line;
    forming a sixth transistor forming a second access transistor having a gate and having a first source/drain region coupled to the output of the second inverter and a second source/drain region for communicating to a second bit line;
    forming at least one insulating layer in a position relative to the first through sixth transistors;
    applying a first mask to the at least one insulating layer to form a plurality of vias through the at least one insulating layer;
    forming a first conducting layer comprising a plurality of conducting plugs in the plurality of vias, wherein the plurality of conducting plugs comprise:
        a first conducting plug coupled to the first source/drain region of the first drive transistor;
        a second conducting plug coupled to the first source/drain region of the first pull-up transistor and to the gate of the second drive transistor and to the gate of the second pull-up transistor;
        a third conducting plug coupled to the first source/drain region of the second drive transistor; and
        a fourth conducting plug coupled to the first source/drain region of the second pull-up transistor and to the gate of the first drive transistor and to the gate of the first pull-up transistor;
    forming a second conducting layer comprising a plurality of conducting elements, wherein the plurality of conducting elements comprise:
        a first conducting element coupled to and physically contacting the first conducting plug and coupled to and physically contacting the second conducting plug; and
        a second conducting element coupled to and physically contacting the third conducting plug and coupled to and physically contacting the fourth conducting plug.

2. The method of claim 1 wherein the step of forming a second conducting layer comprising a plurality of conducting elements comprises applying a next successive mask after the first mask.

3. The method of claim 2 and further comprising applying a surface treatment to the at least one insulating layer and the first conducting layer prior to the step of forming the second conducting layer.

4. The method of claim 2:
    wherein each of the plurality of conducting plugs comprises a lower surface, an upper surface generally parallel to the lower surface, and one or more heights at respective vertical positions between the lower surface and the upper surface; and
    wherein the step of forming a second conducting layer comprises forming a second layer which is parallel to the substrate and having a lower surface extending primarily parallel to the substrate and defining an imaginary plane along the lower surface and primarily parallel to the substrate, and wherein at each reference point proximate a corresponding one of the conducting plugs a vertical distance from the imaginary plane to a lower surface of the corresponding conducting plug is no greater than the height at the corresponding vertical position.

5. The method of claim 4, wherein for each of the six transistor memory cells the cell further comprises:

a first continuous active region strip, comprising:
: the first and second source/drain regions of the first transistor forming a first drive transistor; and
: the first and second source/drain regions of the fifth transistor forming a first access transistor; and a second continuous active region strip, comprising:
: the first and second source/drain regions of the third transistor forming a second drive transistor; and
: the first and second source/drain regions of the sixth transistor forming a second access transistor.

6. The method of claim 5, wherein each of the first and second continuous active region strips comprise a first conductivity type, and wherein for each of the six transistor memory cells the cell further comprises:
: a third continuous active region strip of a second conductivity type differing from the first conductivity type, and comprising the first and second source/drain regions of the second transistor forming a first pull-up transistor; and
: a fourth continuous active region strip of the second conductivity type and comprising the first and second source/drain regions of the fourth transistor forming a second pull-up transistor.

7. The method of claim 6, wherein for each of the six transistor memory cells the first, second, third, and fourth continuous active region strips are aligned in a same dimension.

8. The method of claim 7, wherein for each of the six transistor memory cells the cell further comprises:
: a first conductor structure comprising the gate of the first transistor forming a first drive transistor and the gate of the second transistor forming a first pull-up transistor; and
: a second conductor structure comprising the gate of the third transistor forming a second drive transistor and the gate of the fourth transistor forming a second pull-up transistor.

9. The method of claim 8, wherein the same dimension comprises a first same dimension, and wherein for each of the six transistor memory cells the first and second conductor structures are aligned in a second same dimension that is generally perpendicular to the first same dimension.

10. The method of claim 9, wherein for each of the six transistor memory cells the cell further comprises:
: a third conductor structure comprising the gate of the fifth transistor forming a first access transistor; and
: a fourth conductor structure comprising the gate of the sixth transistor forming a second access transistor.

11. The method of claim 10 wherein for each of the six transistor memory cells the third and fourth conductor structures are aligned in the second same dimension.

12. The method of claim 11, wherein for each of the six transistor memory cells, the first conducting layer comprises tungsten and the second conducting layer comprises aluminum.

13. The method of claim 11, wherein for each of the six transistor memory cells, the first conducting layer comprises tungsten and the second conducting layer comprises copper.

14. The method of claim 11, wherein for each of the six transistor memory cells, the first conducting layer comprises at least one material selected from the group consisting of titanium, titanium nitride, tungsten aluminum and copper.

15. The method of claim 11, wherein for each of the six transistor memory cells, the second conducting layer comprises at least one material selected from the group consisting of titanium, titanium nitride, tungsten aluminum and copper.

16. The method of claim 11, wherein for each of the six transistor memory cells:
: the first conducting layer comprises at least one material selected from the group consisting of titanium, titanium nitride, tungsten aluminum and copper; and
: the second conducting layer comprises at least one material selected from the group consisting of titanium, titanium nitride, tungsten aluminum and copper.

17. The method of claim 2:
: wherein the second conducting plug has a length and a width;
: wherein the length of the second conducting plug is greater than the width of the second conducting plug;
: wherein the length of the second conducting plug is primarily perpendicular to the gate of the first drive transistor and to the gate of the first pull-up transistor;
: wherein the fourth conducting plug has a length and a width;
: wherein the length of the fourth conducting plug is greater than the width of the fourth conducting plug; and
: wherein the length of the fourth conducting plug is primarily perpendicular to the gate of the second drive transistor and to the gate of the second pull-up transistor.

18. The method of claim 17:
: wherein the length of the second conducting plug is greater than 1.5 times the width of the second conducting plug; and
: wherein the length of the fourth conducting plug is greater than 1.5 times the width of the fourth conducting plug.

19. The method of claim 1:
: wherein each of the plurality of conducting plugs comprises a lower surface proximate and parallel to a substrate, an upper surface parallel to the lower surface, and a height between the lower surface and the upper surface; and
: wherein the step of forming a second conducting layer comprises forming a second layer parallel to the substrate and having a lower surface extending primarily parallel to the substrate, and wherein a distance from the lower surface of the second layer to the lower surface of the plurality of conducting plugs is no greater than the first height.

20. The method of claim 1, wherein for each of the six transistor memory cells the cell further comprises:
: a first continuous active region strip, comprising:
  : the first and second source/drain regions of the first transistor forming a first drive transistor; and
  : the first and second source/drain regions of the fifth transistor forming a first access transistor; and
: a second continuous active region strip, comprising:
  : the first and second source/drain regions of the third transistor forming a second drive transistor; and
  : the first and second source/drain regions of the sixth transistor forming a second access transistor.

21. The method of claim 20, wherein each of the first and second continuous active region strips comprise a first conductivity type, and wherein for each of the six transistor memory cells the cell further comprises:
: a third continuous active region strip of a second conductivity type differing from the first conductivity type, and comprising the first and second source/drain regions of the second transistor forming a first pull-up transistor; and a fourth continuous active region strip of the second conductivity type and comprising the first and second source/drain regions of the fourth transistor forming a second pull-up transistor.

22. The method of claim 21, wherein for each of the six transistor memory cells the first, second, third, and fourth continuous active region strips are aligned in a same dimension.

23. The method of claim 21, wherein for each of the six transistor memory cells the cell further comprises:
a first conductor structure comprising the gate of the first transistor forming a first drive transistor and the gate of the second transistor forming a first pull-up transistor; and
a second conductor structure comprising the gate of the third transistor forming a second drive transistor and the gate of the fourth transistor forming a second pull-up transistor.

24. The method of claim 23, wherein the same dimension comprises a first same dimension, and wherein for each of the six transistor memory cells the first and second conductor structures are aligned in a second same dimension that is generally perpendicular to the first same dimension.

25. The method of claim 24, wherein for each of the six transistor memory cells the cell further comprises:
a third conductor structure comprising the gate of the fifth transistor forming a first access transistor; and
a fourth conductor structure comprising the gate of the sixth transistor forming a second access transistor.

26. The method of claim 25 wherein for each of the six transistor memory cells the third and fourth conductor structures are aligned in the second same dimension.

27. The method of claim 26, wherein for each of the six transistor memory cells, the first conducting layer comprises tungsten and the second conducting layer comprises copper.

28. The method of claim 1 wherein for each of the six transistor memory cells:
the first conducting layer and the gates of each of the first through the sixth transistors share a common first plane; and
the second conducting layer is located at a plane different than the common first plane.

29. The method of claim 28:
wherein the second conducting plug has a length and a width;
wherein the length of the second conducting plug is greater than the width of the second conducting plug;
wherein the length of the second conducting plug is primarily perpendicular to the gate of the first drive transistor and to the gate of the first pull-up transistor;
wherein the fourth conducting plug has a length and a width;
wherein the length of the fourth conducting plug is greater than the width of the fourth conducting plug; and
wherein the length of the fourth conducting plug is primarily perpendicular to the gate of the second drive transistor and to the gate of the second pull-up transistor.

30. The method of claim 29:
wherein the length of the second conducting plug is greater than 1.5 times the width of the second conducting plug; and
wherein the length of the fourth conducting plug is greater than 1.5 times the width of the fourth conducting plug.

31. A method of forming a memory circuit comprising a plurality of six transistor memory cells, comprising the steps for each of the six transistor memory cells of:
forming a first inverter having an input and an output, and comprising:
a first transistor forming a first drive transistor comprising first and second source/drain regions and a gate;
a second transistor forming a first pull-up transistor comprising first and second source/drain regions and a gate;
wherein the output of the first inverter is coupled to the first source/drain region of the first drive transistor and to the first source/drain region of the first pull up transistor;
forming a second inverter having an input and an output, and comprising:
a third transistor forming a second drive transistor comprising first and second source/drain regions and a gate;
a fourth transistor forming a second pull-up transistor comprising first and second source/drain regions and a gate;
wherein the output of the second inverter is coupled to the first source/drain region of the second drive transistor and to the first source/drain region of the second pull up transistor;
forming a fifth transistor forming a first access transistor having a gate and having a first source/drain region coupled to the output of the first inverter and a second source/drain region for communicating to a first bit line;
forming a sixth transistor forming a second access transistor having a gate and having a first source/drain region coupled to the output of the second inverter and a second source/drain region for communicating to a second bit line;
forming at least one insulating layer in a position relative to the first through sixth transistors;
applying a first mask to the at least one insulating layer to form a plurality of vias through the at least one insulating layer;
forming a first conducting layer comprising a plurality of conducting plugs in the plurality of vias, wherein the plurality of conducting plugs comprise:
a first set of conducting plugs, wherein each plug in the first set is coupled to any one of either any of the source/drain regions or the gate of any of the first through sixth transistors;
a second set of conducting plugs, wherein each plug in the second set is coupled to more than one of either any of the source/drain regions or the gate of any of the first through sixth transistors;
forming a second conducting layer comprising a plurality of conducting elements, wherein the plurality of conducting elements comprise:
a first set of conducting elements, wherein each element in the first set of conducting elements is coupled to only one conducting plug in the first set of conducting plugs; and
a second set of conducting elements, wherein each element in the second set of conducting elements is coupled between a conducting plug in the first set of conducting plugs and a conducting plug in the second set of conducting plugs.

32. The method of claim 31 wherein the step of forming a second conducting layer comprising a plurality of conducting elements comprises applying a next successive mask after the first mask.

33. A memory circuit comprising a plurality of six transistor memory cells, wherein each of the six transistor memory cells comprises:
- a first inverter having an input and an output, and comprising:
    - a first transistor forming a first drive transistor comprising first and second source/drain regions and a gate;
    - a second transistor forming a first pull-up transistor comprising first and second source/drain regions and a gate;
    - wherein the output of the first inverter is coupled the first source/drain region of the first drive transistor and to the first source/drain region of the first pull up transistor;
- a second inverter having an input and an output, and comprising:
    - a third transistor forming a second drive transistor comprising first and second source/drain regions and a gate;
    - a fourth transistor forming a second pull-up transistor comprising first and second source/drain regions and a gate;
    - wherein the output of the second inverter is coupled to the first source/drain region of the second drive transistor and to the first source/drain region of the second pull up transistor;
- a fifth transistor forming a first access transistor having a gate and having a first source/drain region coupled to the output of the first inverter and a second source/drain region for communicating to a first bit line;
- a sixth transistor forming a second access transistor having a gate and having a first source/drain region coupled to the output of the second inverter and a second source/drain region for communicating to a second bit line;
- at least one insulating layer in a position relative to the first through sixth transistors;
- forming a first conducting layer comprising a plurality of conducting plugs formed in a plurality of vias in the at least one insulating layer, wherein the plurality of conducting plugs comprise:
    - a first conducting plug coupled to the first source drain of the first drive transistor;
    - a second conducting plug coupled to the first source/drain region of the first pull-up transistor and to the gate of the second drive transistor and to the gate of the second pull-up transistor;
    - a third conducting plug coupled to the first source/drain region of the second drive transistor; and
    - a fourth conducting plug coupled to the first source/drain region of the second pull-up transistor and to the gate of the first drive transistor and to the gate of the first pull-up transistor;
- a second conducting layer comprising a plurality of conducting elements, wherein the plurality of conducting elements comprise:
    - a first conducting element coupled to and physically contacting the first conducting plug and coupled to and physically contacting the second conducting plug; and
    - a second conducting element coupled to and physically contacting the third conducting plug and coupled to and physically contacting the fourth conducting plug.

34. The memory circuit of claim 33:
- wherein each of the plurality of conducting plugs comprises a lower surface, an upper surface generally parallel to the lower surface, and one or more heights at respective vertical positions between the lower surface and the upper surface; and
- wherein the step of forming a second conducting layer comprises forming a second layer which is parallel to the substrate and having a lower surface extending primarily parallel to the substrate, and wherein the lower surface of the second layer at each reference point proximate a corresponding one of the conducting plugs is at a vertical distance from the lower surface of the corresponding conducting plug that is no greater than the height at the corresponding vertical position.

* * * * *

UNITED STATES PATENT AND TRADEMARK OFFICE
CERTIFICATE OF CORRECTION

PATENT NO. : 7,087,493 B1  Page 1 of 1
APPLICATION NO. : 09/921394
DATED : August 8, 2006
INVENTOR(S) : Sudhir K. Madan It is certified that error appears in the above-identified patent and that said Letters Patent is hereby corrected as shown below:

Column 19, Line 61 change "output of the second inverter is coupled to the second source/drain region" to -- output of the second inverter is coupled to the first source/drain region --

Signed and Sealed this

Seventh Day of July, 2009

JOHN DOLL
*Acting Director of the United States Patent and Trademark Office*